United States Patent
Yang et al.

(10) Patent No.: US 10,032,606 B2
(45) Date of Patent: Jul. 24, 2018

(54) SEMICONDUCTOR PROCESSING WITH DC ASSISTED RF POWER FOR IMPROVED CONTROL

(71) Applicant: Applied Materials, Inc., Santa Clara, CA (US)

(72) Inventors: Jang-Gyoo Yang, San Jose, CA (US);
Xinglong Chen, San Jose, CA (US);
Soonam Park, Sunnyvale, CA (US);
Jonghoon Baek, San Jose, CA (US);
Saurabh Garg, San Jose, CA (US);
Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 218 days.

(21) Appl. No.: 15/187,211

(22) Filed: Jun. 20, 2016

(65) Prior Publication Data

US 2016/0300694 A1    Oct. 13, 2016

Related U.S. Application Data

(62) Division of application No. 13/829,669, filed on Mar. 14, 2013, now Pat. No. 9,373,517.
(Continued)

(51) Int. Cl.
*C23C 16/503* (2006.01)
*H01J 37/32* (2006.01)
(Continued)

(52) U.S. Cl.
CPC ........ *H01J 37/32091* (2013.01); *C23C 16/50* (2013.01); *C23C 16/503* (2013.01);
(Continued)

(58) Field of Classification Search
CPC ..... C23C 16/50; C23C 16/503; C23C 16/505; C23C 16/509; C23C 16/5093; H01L 21/3065; H01L 21/32136
(Continued)

(56) References Cited

U.S. PATENT DOCUMENTS

| | | |
|---|---|---|
| 2,369,620 A | 2/1945 | Sullivan et al. |
| 3,401,302 A | 9/1968 | Thorpe |

(Continued)

FOREIGN PATENT DOCUMENTS

| | | |
|---|---|---|
| CN | 1124364 A | 6/1996 |
| CN | 1614746 A | 5/2005 |

(Continued)

OTHER PUBLICATIONS

International Search Report and Written Opinion of PCT/US2016/045551 dated Nov. 17, 2016, all pages.
(Continued)

*Primary Examiner* — Rudy Zervigon
(74) *Attorney, Agent, or Firm* — Kilpatrick Townsend & Stockton LLP

(57) ABSTRACT

Semiconductor processing systems are described including a process chamber. The process chamber may include a lid assembly, grid electrode, conductive insert, and ground electrode. Each component may be coupled with one or more power supplies operable to produce a plasma within the process chamber. Each component may be electrically isolated through the positioning of a plurality of insulation members. The one or more power supplies may be electrically coupled with the process chamber with the use of switching mechanisms. The switches may be switchable to electrically couple the one or more power supplies to the components of the process chamber.

13 Claims, 7 Drawing Sheets

Related U.S. Application Data

(60) Provisional application No. 61/678,964, filed on Aug. 2, 2012.

(51) Int. Cl.
   | | |
   |---|---|
   | *H01L 21/3065* | (2006.01) |
   | *H01L 21/67* | (2006.01) |
   | *C23C 16/50* | (2006.01) |
   | *C23C 16/505* | (2006.01) |
   | *C23C 16/509* | (2006.01) |
   | *H01L 21/3213* | (2006.01) |
   | *H01L 21/02* | (2006.01) |
   | *H01L 21/285* | (2006.01) |
   | *H01L 21/311* | (2006.01) |

(52) U.S. Cl.
   CPC .......... *C23C 16/505* (2013.01); *C23C 16/509* (2013.01); *C23C 16/5093* (2013.01); *H01J 37/3244* (2013.01); *H01J 37/32146* (2013.01); *H01J 37/32422* (2013.01); *H01J 37/32568* (2013.01); *H01L 21/3065* (2013.01); *H01L 21/67069* (2013.01); *H01L 21/67075* (2013.01); *H01J 2237/332* (2013.01); *H01J 2237/334* (2013.01); *H01L 21/0262* (2013.01); *H01L 21/02274* (2013.01); *H01L 21/28556* (2013.01); *H01L 21/31116* (2013.01); *H01L 21/31138* (2013.01); *H01L 21/32136* (2013.01)

(58) Field of Classification Search
USPC ..... 118/715, 722, 723 R, 723 E; 156/345.33, 156/345.34, 345.43–345.47
See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A * | 4/1991 | Deguchi ........... H01J 37/32862 118/715 |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A * | 10/1993 | Moslehi ............. C23C 16/4405 118/50.1 |
| 5,266,157 A | 11/1993 | Kadomura |
| 5,269,881 A * | 12/1993 | Sekiya .................. B08B 7/0035 134/1 |
| 5,270,125 A | 12/1993 | America et al. |
| 5,271,972 A | 12/1993 | Kwok et al. |
| 5,275,977 A | 1/1994 | Otsubo et al. |
| 5,277,750 A | 1/1994 | Wolgang |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,292,370 A * | 3/1994 | Tsai .................. H01J 37/32082 118/715 |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |

(56) References Cited

U.S. PATENT DOCUMENTS

| | | |
|---|---|---|
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,464,499 A * | 11/1995 | Moslehi ............. C23C 16/4405 134/1 |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,592,358 A | 1/1997 | Shamouilian |
| 5,599,740 A | 2/1997 | Jang et al. |
| 5,614,055 A * | 3/1997 | Fairbairn ............. H01J 37/321 118/723 AN |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A * | 8/1997 | Ravi .................... C23C 16/401 257/E21.271 |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A * | 5/1998 | Iwamura ............. H01J 37/32357 156/345.35 |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A * | 9/1998 | Robles .................. B05D 1/60 118/723 AN |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A * | 2/1999 | Nowak ............. H01J 37/32091 118/723 AN |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |

(56) References Cited

U.S. PATENT DOCUMENTS

| | | | |
|---|---|---|---|
| 5,990,013 A | 11/1999 | Berenguer et al. | |
| 5,993,916 A | 11/1999 | Zhao et al. | |
| 5,994,209 A | 11/1999 | Yieh et al. | |
| 5,997,962 A | 12/1999 | Ogasawara et al. | |
| 6,004,884 A | 12/1999 | Abraham | |
| 6,007,635 A | 12/1999 | Mahawili | |
| 6,007,785 A * | 12/1999 | Liou | C01B 13/11 422/186.04 |
| 6,010,962 A | 1/2000 | Liu et al. | |
| 6,013,191 A | 1/2000 | Nasser-Faili et al. | |
| 6,013,584 A * | 1/2000 | M'Saad | C23C 16/401 257/E21.275 |
| 6,015,724 A | 1/2000 | Yamazaki et al. | |
| 6,015,747 A | 1/2000 | Lopatin et al. | |
| 6,017,414 A | 1/2000 | Koemtzopoulos et al. | |
| 6,019,848 A | 2/2000 | Kiyama et al. | |
| 6,020,271 A | 2/2000 | Yanagida | |
| 6,030,666 A | 2/2000 | Lam et al. | |
| 6,030,881 A | 2/2000 | Papasouliotis et al. | |
| 6,035,101 A | 3/2000 | Sajoto et al. | |
| 6,036,878 A | 3/2000 | Collins et al. | |
| 6,037,018 A | 3/2000 | Jang et al. | |
| 6,037,266 A | 3/2000 | Tao et al. | |
| 6,039,834 A | 3/2000 | Tanaka et al. | |
| 6,039,851 A | 3/2000 | Iyer | |
| 6,053,982 A | 4/2000 | Halpin et al. | |
| 6,059,643 A | 5/2000 | Hu et al. | |
| 6,063,683 A | 5/2000 | Wu et al. | |
| 6,063,712 A | 5/2000 | Gilton et al. | |
| 6,065,424 A | 5/2000 | Shacham-Diamand et al. | |
| 6,065,425 A | 5/2000 | Takaki et al. | |
| 6,072,147 A | 6/2000 | Koshiishi | |
| 6,072,227 A | 6/2000 | Yau et al. | |
| 6,074,512 A * | 6/2000 | Collins | C23C 16/517 118/723 AN |
| 6,074,514 A | 6/2000 | Bjorkman et al. | |
| 6,077,384 A | 6/2000 | Collins et al. | |
| 6,077,780 A | 6/2000 | Dubin | |
| 6,080,529 A | 6/2000 | Ye et al. | |
| 6,081,414 A | 6/2000 | Flanigan et al. | |
| 6,083,344 A | 7/2000 | Hanawa et al. | |
| 6,083,844 A | 7/2000 | Bui-Le et al. | |
| 6,086,677 A | 7/2000 | Umotoy et al. | |
| 6,087,278 A | 7/2000 | Kim et al. | |
| 6,090,212 A | 7/2000 | Mahawili | |
| 6,093,457 A | 7/2000 | Okumura | |
| 6,093,594 A | 7/2000 | Yeap et al. | |
| 6,099,697 A | 8/2000 | Hausmann | |
| 6,107,199 A | 8/2000 | Allen et al. | |
| 6,110,530 A | 8/2000 | Chen et al. | |
| 6,110,832 A | 8/2000 | Morgan et al. | |
| 6,110,836 A | 8/2000 | Cohen et al. | |
| 6,110,838 A | 8/2000 | Loewenstein | |
| 6,113,771 A | 9/2000 | Landau et al. | |
| 6,114,216 A | 9/2000 | Yieh et al. | |
| 6,117,245 A | 9/2000 | Mandrekar et al. | |
| 6,120,640 A | 9/2000 | Shih et al. | |
| 6,136,163 A | 10/2000 | Cheung et al. | |
| 6,136,165 A | 10/2000 | Moslehi et al. | |
| 6,136,685 A | 10/2000 | Narwankar et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,147,009 A | 11/2000 | Grill et al. | |
| 6,149,828 A | 11/2000 | Vaartstra | |
| 6,150,628 A | 11/2000 | Smith et al. | |
| 6,153,935 A | 11/2000 | Edelstein et al. | |
| 6,161,576 A | 12/2000 | Maher et al. | |
| 6,162,302 A | 12/2000 | Raghavan et al. | |
| 6,165,912 A | 12/2000 | McConnell et al. | |
| 6,167,834 B1 | 1/2001 | Wang et al. | |
| 6,169,021 B1 | 1/2001 | Akram et al. | |
| 6,170,428 B1 | 1/2001 | Redeker et al. | |
| 6,171,661 B1 | 1/2001 | Zheng et al. | |
| 6,174,450 B1 | 1/2001 | Patrick et al. | |
| 6,174,812 B1 | 1/2001 | Hsuing et al. | |
| 6,176,198 B1 | 1/2001 | Kao et al. | |
| 6,176,667 B1 | 1/2001 | Fairbairn | |
| 6,177,245 B1 | 1/2001 | Ward et al. | |
| 6,179,924 B1 | 1/2001 | Zhao et al. | |
| 6,180,523 B1 | 1/2001 | Lee et al. | |
| 6,182,602 B1 | 2/2001 | Redeker et al. | |
| 6,182,603 B1 | 2/2001 | Shang et al. | |
| 6,184,121 B1 | 2/2001 | Buchwalter et al. | |
| 6,186,091 B1 | 2/2001 | Chu et al. | |
| 6,189,483 B1 | 2/2001 | Ishikawa et al. | |
| 6,190,233 B1 | 2/2001 | Hong et al. | |
| 6,194,038 B1 | 2/2001 | Rossman | |
| 6,197,181 B1 | 3/2001 | Chen | |
| 6,197,364 B1 | 3/2001 | Paunovic et al. | |
| 6,197,680 B1 | 3/2001 | Lin et al. | |
| 6,197,688 B1 | 3/2001 | Simpson | |
| 6,197,705 B1 | 3/2001 | Vassiliev | |
| 6,198,616 B1 | 3/2001 | Dahimene et al. | |
| 6,203,863 B1 | 3/2001 | Liu et al. | |
| 6,204,200 B1 | 3/2001 | Shieh et al. | |
| 6,210,486 B1 | 4/2001 | Mizukami et al. | |
| 6,217,658 B1 | 4/2001 | Orczyk et al. | |
| 6,220,201 B1 * | 4/2001 | Nowak | H01J 37/32091 118/723 AN |
| 6,225,745 B1 | 5/2001 | Srivastava | |
| 6,228,233 B1 | 5/2001 | Lakshmikanthan et al. | |
| 6,228,751 B1 | 5/2001 | Yamazaki et al. | |
| 6,228,758 B1 | 5/2001 | Pellerin et al. | |
| 6,235,643 B1 | 5/2001 | Mui et al. | |
| 6,237,527 B1 | 5/2001 | Kellerman et al. | |
| 6,238,513 B1 | 5/2001 | Arnold et al. | |
| 6,238,582 B1 | 5/2001 | Williams et al. | |
| 6,197,151 B1 | 6/2001 | Kaji et al. | |
| 6,241,845 B1 | 6/2001 | Gadgil et al. | |
| 6,242,349 B1 | 6/2001 | Nogami et al. | |
| 6,244,211 B1 * | 6/2001 | Nishikawa | C23C 16/4401 118/723 AN |
| 6,245,396 B1 | 6/2001 | Nogami | |
| 6,245,670 B1 | 6/2001 | Cheung et al. | |
| 6,251,236 B1 | 6/2001 | Stevens | |
| 6,251,802 B1 | 6/2001 | Moore et al. | |
| 6,258,170 B1 | 7/2001 | Somekh et al. | |
| 6,258,220 B1 | 7/2001 | Dordi et al. | |
| 6,258,223 B1 | 7/2001 | Cheung et al. | |
| 6,258,270 B1 | 7/2001 | Hilgendorff et al. | |
| 6,261,637 B1 | 7/2001 | Oberle | |
| 6,277,733 B1 | 8/2001 | Smith | |
| 6,277,752 B1 | 8/2001 | Chen | |
| 6,277,763 B1 | 8/2001 | Kugimiya et al. | |
| 6,281,072 B1 | 8/2001 | Li et al. | |
| 6,281,135 B1 | 8/2001 | Han et al. | |
| 6,284,146 B1 | 9/2001 | Kim et al. | |
| 6,291,282 B1 | 9/2001 | Wilk et al. | |
| 6,291,348 B1 | 9/2001 | Lopatin et al. | |
| 6,303,044 B1 | 10/2001 | Koemtzopoulos | |
| 6,303,418 B1 | 10/2001 | Cha et al. | |
| 6,306,772 B1 | 10/2001 | Lin | |
| 6,308,776 B1 | 10/2001 | Sloan | |
| 6,312,554 B1 | 11/2001 | Ye | |
| 6,312,995 B1 | 11/2001 | Yu | |
| 6,319,387 B1 | 11/2001 | Krishnamoorthy et al. | |
| 6,321,587 B1 | 11/2001 | Laush | |
| 6,322,716 B1 | 11/2001 | Qiao et al. | |
| 6,323,128 B1 | 11/2001 | Sambucetti et al. | |
| 6,335,288 B1 | 1/2002 | Kwan et al. | |
| 6,340,435 B1 | 1/2002 | Bjorkman et al. | |
| 6,342,733 B1 | 1/2002 | Hu et al. | |
| RE37,546 E | 2/2002 | Mahawili | |
| 6,344,410 B1 | 2/2002 | Lopatin et al. | |
| 6,348,407 B1 | 2/2002 | Gupta et al. | |
| 6,350,320 B1 | 2/2002 | Sherstinsky et al. | |
| 6,350,697 B1 | 2/2002 | Richardson | |
| 6,351,013 B1 | 2/2002 | Luning et al. | |
| 6,352,081 B1 | 3/2002 | Lu et al. | |
| 6,355,573 B1 | 3/2002 | Okumura | |
| 6,364,949 B1 | 4/2002 | Or et al. | |
| 6,364,954 B2 | 4/2002 | Umotoy et al. | |
| 6,364,957 B1 | 4/2002 | Schneider et al. | |

(56) References Cited

U.S. PATENT DOCUMENTS

| | | | |
|---|---|---|---|
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,051 B1 * | 10/2002 | Sahin ............. C23C 16/4405 118/723 E |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,585,851 B1 * | 7/2003 | Ohmi ............... H01J 37/32082 118/723 E |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,736,147 B2 | 5/2004 | Satoh et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 * | 8/2004 | Fischer ............. H01J 37/32091 156/345.44 |
| 6,772,827 B2 | 8/2004 | Keller et al. |
| 6,792,889 B2 * | 9/2004 | Nakano ............. H01J 37/32183 118/723 E |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,821,571 B2 | 11/2004 | Huang |
| 6,823,589 B2 | 11/2004 | White et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 * | 5/2005 | Yang ............... H01J 37/32082 118/723 I |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 * | 8/2005 | Lee ................... H01J 37/32357 118/723 AN |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,052,553 B1 | 5/2006 | Shih et al. |

(56) References Cited

U.S. PATENT DOCUMENTS

| | | | |
|---|---|---|---|
| 7,071,532 | B2 | 7/2006 | Geffken et al. |
| 7,084,070 | B1 | 8/2006 | Lee et al. |
| 7,115,525 | B2 | 10/2006 | Abatchev et al. |
| 7,122,949 | B2 | 10/2006 | Strikovski |
| 7,138,767 | B2 | 11/2006 | Chen et al. |
| 7,145,725 | B2 | 12/2006 | Hasel et al. |
| 7,148,155 | B1 | 12/2006 | Tarafdar et al. |
| 7,166,233 | B2 | 1/2007 | Johnson et al. |
| 7,183,214 | B2 | 2/2007 | Nam et al. |
| 7,196,342 | B2 | 3/2007 | Ershov et al. |
| 7,226,805 | B2 | 6/2007 | Hallin et al. |
| 7,235,137 | B2 | 6/2007 | Kitayama et al. |
| 7,244,474 | B2 * | 7/2007 | Hanawa ............... C23C 16/402 118/723 ER |
| 7,252,011 | B2 | 8/2007 | Traverso |
| 7,252,716 | B2 | 8/2007 | Kim et al. |
| 7,253,123 | B2 | 8/2007 | Arghavani et al. |
| 7,256,370 | B2 | 8/2007 | Guiver |
| 7,288,482 | B2 | 10/2007 | Panda et al. |
| 7,291,360 | B2 * | 11/2007 | Hanawa ............... C23C 16/402 118/719 |
| 7,316,761 | B2 * | 1/2008 | Doan ............... H01J 37/32009 118/715 |
| 7,329,608 | B2 * | 2/2008 | Babayan ............... H01L 23/08 156/345.45 |
| 7,341,633 | B2 | 3/2008 | Lubomirsky et al. |
| 7,344,912 | B1 | 3/2008 | Okoroanyanwu |
| 7,358,192 | B2 | 4/2008 | Merry et al. |
| 7,361,865 | B2 | 4/2008 | Maki et al. |
| 7,364,956 | B2 | 4/2008 | Saito |
| 7,365,016 | B2 | 4/2008 | Ouellet et al. |
| 7,396,480 | B2 | 7/2008 | Kao et al. |
| 7,396,773 | B1 | 7/2008 | Blosse et al. |
| 7,416,989 | B1 | 8/2008 | Liu et al. |
| 7,465,358 | B2 | 12/2008 | Weidman et al. |
| 7,465,953 | B1 | 12/2008 | Koh et al. |
| 7,468,319 | B2 | 12/2008 | Lee |
| 7,479,303 | B2 | 1/2009 | Byun et al. |
| 7,484,473 | B2 | 2/2009 | Keller et al. |
| 7,488,688 | B2 | 2/2009 | Chung et al. |
| 7,494,545 | B2 | 2/2009 | Lam et al. |
| 7,500,445 | B2 * | 3/2009 | Zhao ............... C23C 16/4405 118/723 E |
| 7,513,214 | B2 | 4/2009 | Okumura et al. |
| 7,520,957 | B2 | 4/2009 | Kao et al. |
| 7,553,756 | B2 | 6/2009 | Hayashi et al. |
| 7,575,007 | B2 | 8/2009 | Tang et al. |
| 7,581,511 | B2 | 9/2009 | Mardian et al. |
| 7,604,708 | B2 | 10/2009 | Wood et al. |
| 7,611,980 | B2 | 11/2009 | Wells |
| 7,628,897 | B2 | 12/2009 | Mungekar et al. |
| 7,658,799 | B2 | 2/2010 | Ishikawa et al. |
| 7,682,518 | B2 | 3/2010 | Chandrachood et al. |
| 7,695,590 | B2 * | 4/2010 | Hanawa ............... C23C 14/358 118/723 E |
| 7,708,859 | B2 | 5/2010 | Huang et al. |
| 7,722,925 | B2 | 5/2010 | White et al. |
| 7,723,221 | B2 | 5/2010 | Hayashi |
| 7,749,326 | B2 | 7/2010 | Kim et al. |
| 7,785,672 | B2 | 8/2010 | Choi et al. |
| 7,790,634 | B2 | 9/2010 | Munro et al. |
| 7,806,077 | B2 | 10/2010 | Lee et al. |
| 7,806,078 | B2 | 10/2010 | Yoshida |
| 7,807,578 | B2 | 10/2010 | Bencher et al. |
| 7,825,038 | B2 | 11/2010 | Ingle et al. |
| 7,837,828 | B2 | 11/2010 | Ikeda et al. |
| 7,845,309 | B2 * | 12/2010 | Condrashoff ..... H01J 37/32633 118/723 E |
| 7,867,926 | B2 | 1/2011 | Satoh et al. |
| 7,915,139 | B1 | 3/2011 | Lang et al. |
| 7,922,863 | B2 | 4/2011 | Ripley |
| 7,932,181 | B2 | 4/2011 | Singh et al. |
| 7,939,422 | B2 | 5/2011 | Ingle et al. |
| 7,968,441 | B2 | 6/2011 | Xu |
| 7,976,631 | B2 | 7/2011 | Burrows |
| 7,981,806 | B2 | 7/2011 | Jung |
| 7,989,365 | B2 | 8/2011 | Park et al. |
| 8,008,166 | B2 | 8/2011 | Sanchez et al. |
| 8,048,811 | B2 | 11/2011 | Feustel et al. |
| 8,058,179 | B1 | 11/2011 | Draeger et al. |
| 8,071,482 | B2 | 12/2011 | Kawada |
| 8,074,599 | B2 | 12/2011 | Choi et al. |
| 8,076,198 | B2 | 12/2011 | Lee et al. |
| 8,083,853 | B2 | 12/2011 | Choi et al. |
| 8,114,245 | B2 * | 2/2012 | Ohmi ............... H01J 37/32082 118/663 |
| 8,119,530 | B2 | 2/2012 | Hori et al. |
| 8,133,349 | B1 | 3/2012 | Panagopoulos |
| 8,173,228 | B2 | 5/2012 | Choi et al. |
| 8,183,134 | B2 | 5/2012 | Wu |
| 8,187,486 | B1 | 5/2012 | Liu et al. |
| 8,211,808 | B2 | 7/2012 | Sapre et al. |
| 8,216,486 | B2 | 7/2012 | Dhindsa |
| 8,252,194 | B2 | 8/2012 | Kiehlbauch et al. |
| 8,272,346 | B2 * | 9/2012 | Bettencourt ...... H01L 21/67069 118/723 E |
| 8,295,089 | B2 | 10/2012 | Jeong et al. |
| 8,298,627 | B2 | 10/2012 | Minami et al. |
| 8,309,440 | B2 | 11/2012 | Sanchez et al. |
| 8,312,839 | B2 * | 11/2012 | Baek ............... C23C 16/509 118/723 MW |
| 8,313,610 | B2 * | 11/2012 | Dhindsa ............... H01J 37/32091 156/345.27 |
| 8,328,939 | B2 | 12/2012 | Choi et al. |
| 8,329,262 | B2 | 12/2012 | Miller et al. |
| 8,336,188 | B2 | 12/2012 | Monteen |
| 8,357,435 | B2 * | 1/2013 | Lubomirsky ............ B08B 7/00 118/719 |
| 8,368,308 | B2 | 2/2013 | Banna et al. |
| 8,390,980 | B2 | 3/2013 | Sansoni et al. |
| 8,427,067 | B2 | 4/2013 | Espiau et al. |
| 8,435,902 | B2 | 5/2013 | Tang et al. |
| 8,440,523 | B1 | 5/2013 | Guillorn et al. |
| 8,475,674 | B2 | 7/2013 | Thadani et al. |
| 8,480,850 | B2 * | 7/2013 | Tyler ............... H01J 37/32082 118/723 E |
| 8,491,805 | B2 | 7/2013 | Kushibiki et al. |
| 8,501,629 | B2 | 8/2013 | Tang et al. |
| 8,506,713 | B2 | 8/2013 | Takagi |
| 8,512,509 | B2 | 8/2013 | Bera et al. |
| 8,528,889 | B2 | 9/2013 | Sansoni et al. |
| 8,540,844 | B2 * | 9/2013 | Hudson ............... H01J 37/32082 118/719 |
| 8,551,891 | B2 | 10/2013 | Liang |
| 8,573,152 | B2 | 11/2013 | De La Llera |
| 8,622,021 | B2 * | 1/2014 | Taylor ............... C04B 35/593 118/723 R |
| 8,623,471 | B2 * | 1/2014 | Tyler ............... H01J 37/32082 216/67 |
| 8,633,423 | B2 | 1/2014 | Lin et al. |
| 8,652,298 | B2 * | 2/2014 | Dhindsa ............... H01J 37/32165 156/345.45 |
| 8,679,982 | B2 | 3/2014 | Wang et al. |
| 8,679,983 | B2 | 3/2014 | Wang et al. |
| 8,691,023 | B2 | 4/2014 | Bao et al. |
| 8,702,902 | B2 * | 4/2014 | Blom ............... H05H 1/24 156/345.44 |
| 8,741,778 | B2 | 6/2014 | Yang et al. |
| 8,747,680 | B1 | 6/2014 | Deshpande |
| 8,748,322 | B1 | 6/2014 | Fung et al. |
| 8,765,574 | B2 | 7/2014 | Zhang et al. |
| 8,771,536 | B2 * | 7/2014 | Zhang ............... H01L 21/3065 216/67 |
| 8,771,539 | B2 | 7/2014 | Zhang et al. |
| 8,772,888 | B2 | 7/2014 | Jung et al. |
| 8,778,079 | B2 | 7/2014 | Begarney et al. |
| 8,801,952 | B1 | 8/2014 | Wang et al. |
| 8,802,572 | B2 | 8/2014 | Nemani et al. |
| 8,808,563 | B2 | 8/2014 | Wang et al. |
| 8,846,163 | B2 | 9/2014 | Kao et al. |
| 8,869,742 | B2 * | 10/2014 | Dhindsa ............ C23C 16/45565 118/723 E |

(56) References Cited

U.S. PATENT DOCUMENTS

| | | |
|---|---|---|
| 8,871,651 B1 | 10/2014 | Choi et al. |
| 8,888,087 B2 | 11/2014 | Okabe et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1* | 2/2015 | Chen ............... H01L 21/31116 216/79 |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2* | 4/2015 | Zhang ............... H01J 37/32422 216/57 |
| 9,012,302 B2 | 4/2015 | Sapre et al. |
| 9,017,481 B1 | 4/2015 | Pettinger et al. |
| 9,023,732 B2* | 5/2015 | Wang ............... H01L 21/6708 438/706 |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2* | 6/2015 | Zhang ............... H01J 37/32422 |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2* | 9/2015 | Yang ............... C23C 16/45565 |
| 9,153,442 B2 | 10/2015 | Wang et al. |
| 9,159,606 B1* | 10/2015 | Purayath ............... H01L 21/7682 |
| 9,165,783 B2 | 10/2015 | Nemani et al. |
| 9,165,786 B1* | 10/2015 | Purayath ............... H01L 21/31116 |
| 9,184,055 B2 | 11/2015 | Wang et al. |
| 9,190,293 B2* | 11/2015 | Wang ............... H01L 21/32136 |
| 9,190,302 B2* | 11/2015 | Ni ............... H01J 37/32082 |
| 9,209,012 B2 | 12/2015 | Chen et al. |
| 9,236,265 B2* | 1/2016 | Korolik ............... H01L 21/3065 |
| 9,236,266 B2 | 1/2016 | Zhang et al. |
| 9,240,315 B1 | 1/2016 | Hsieh et al. |
| 9,245,762 B2* | 1/2016 | Zhang ............... H01L 21/3065 |
| 9,263,278 B2 | 2/2016 | Purayath et al. |
| 9,269,590 B2 | 2/2016 | Luere et al. |
| 9,275,834 B1 | 3/2016 | Park et al. |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,418,858 B2 | 8/2016 | Wang et al. |
| 9,425,041 B2 | 8/2016 | Berry et al. |
| 9,425,058 B2 | 8/2016 | Kim et al. |
| 9,431,268 B2 | 8/2016 | Lill et al. |
| 9,437,451 B2 | 9/2016 | Chen et al. |
| 9,443,749 B2 | 9/2016 | Smith |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,809 B2 | 2/2017 | Korolik et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,837,249 B2 | 12/2017 | Kobayashi et al. |
| 9,837,284 B2 | 12/2017 | Chen et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 2001/0006093 A1 | 7/2001 | Tabuchi |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0036706 A1 | 11/2001 | Kitamura |
| 2001/0037856 A1 | 11/2001 | Park |
| 2001/0037941 A1* | 11/2001 | Thompson ............... B03C 5/02 204/571 |
| 2001/0039921 A1 | 11/2001 | Rolfson et al. |
| 2001/0042512 A1 | 11/2001 | Xu et al. |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |

(56) References Cited

U.S. PATENT DOCUMENTS

| | | |
|---|---|---|
| 2002/0011210 A1 | 1/2002 | Satoh et al. |
| 2002/0011214 A1 | 1/2002 | Kamarehi et al. |
| 2002/0016080 A1 | 2/2002 | Khan et al. |
| 2002/0016085 A1 | 2/2002 | Huang et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O-Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1* | 9/2002 | Babayan ............. C23C 16/402 156/345.45 |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0007910 A1* | 1/2003 | Diamant Lazarovich ......... B01D 53/326 422/186.18 |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1* | 2/2003 | Dhindsa ............ H01J 37/32082 156/345.47 |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0121609 A1* | 7/2003 | Ohmi ............... H01J 37/32082 156/345.47 |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1* | 7/2003 | Hytros ............. C23C 16/45565 239/548 |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196760 A1* | 10/2003 | Tyler ................ H01J 37/32082 156/345.47 |
| 2003/0199170 A1 | 10/2003 | Li |
| 2003/0200929 A1 | 10/2003 | Otsuki |
| 2003/0205329 A1 | 11/2003 | Gujer et al. |
| 2003/0209323 A1 | 11/2003 | Yokogaki et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0005726 A1 | 1/2004 | Huang |
| 2004/0018304 A1 | 1/2004 | Chung et al. |
| 2004/0020801 A1 | 2/2004 | Solling |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0107908 A1 | 6/2004 | Collins et al. |
| 2004/0108067 A1 | 6/2004 | Fischione et al. |
| 2004/0108068 A1* | 6/2004 | Senzaki ............ H01J 37/32458 156/345.43 |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1* | 7/2004 | Zhao .................. C23C 16/4405 156/345.47 |
| 2004/0147126 A1 | 7/2004 | Yamashita et al. |
| 2004/0149223 A1 | 8/2004 | Collison et al. |
| 2004/0149394 A1* | 8/2004 | Doan ................ H01J 37/32009 216/67 |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson et al. |
| 2004/0192032 A1 | 9/2004 | Ohmori et al. |
| 2004/0194799 A1 | 10/2004 | Kim et al. |

(56) References Cited

U.S. PATENT DOCUMENTS

| | | |
|---|---|---|
| 2004/0195216 A1 | 10/2004 | Strang |
| 2004/0200499 A1 | 10/2004 | Harvey |
| 2004/0211357 A1 | 10/2004 | Gadgil et al. |
| 2004/0219737 A1* | 11/2004 | Quon ............... H01J 37/321 438/222 |
| 2004/0219789 A1 | 11/2004 | Wood et al. |
| 2004/0231706 A1 | 11/2004 | Bhatnagar et al. |
| 2004/0263827 A1 | 12/2004 | Xu |
| 2005/0000432 A1 | 1/2005 | Keller et al. |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0056218 A1 | 3/2005 | Sun et al. |
| 2005/0073051 A1 | 4/2005 | Yamamoto et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0103267 A1 | 5/2005 | Hur et al. |
| 2005/0105991 A1 | 5/2005 | Hofmeister et al. |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0136188 A1 | 6/2005 | Chang |
| 2005/0145341 A1 | 7/2005 | Suzuki |
| 2005/0164479 A1 | 7/2005 | Perng et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0181588 A1 | 8/2005 | Kim |
| 2005/0183666 A1 | 8/2005 | Tsuji et al. |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1* | 9/2005 | Hanawa ............... C23C 16/402 427/569 |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0269030 A1 | 12/2005 | Kent et al. |
| 2005/0274324 A1 | 12/2005 | Takahashi et al. |
| 2005/0279454 A1 | 12/2005 | Snijders |
| 2005/0283321 A1 | 12/2005 | Yue et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1* | 1/2006 | Condrashoff ..... H01J 37/32834 156/345.47 |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1 | 2/2006 | Armour et al. |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210723 A1 | 9/2006 | Ishizaka |
| 2006/0215347 A1 | 9/2006 | Wakabayashi |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0292846 A1 | 12/2006 | Pinto et al. |
| 2007/0022952 A1 | 2/2007 | Ritchie et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |

(56) References Cited

U.S. PATENT DOCUMENTS

| | | |
|---|---|---|
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0131274 A1 | 6/2007 | Stollwerck et al. |
| 2007/0145023 A1 | 6/2007 | Holber et al. |
| 2007/0154838 A1 | 7/2007 | Lee |
| 2007/0163440 A1 | 7/2007 | Kim et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0277734 A1 | 12/2007 | Lubomirsky et al. |
| 2007/0280816 A1 | 12/2007 | Kurita et al. |
| 2007/0281106 A1 | 12/2007 | Lubomirsky et al. |
| 2007/0287292 A1 | 12/2007 | Li et al. |
| 2007/0296967 A1 | 12/2007 | Gupta et al. |
| 2008/0017104 A1 | 1/2008 | Matyushkin et al. |
| 2008/0020570 A1 | 1/2008 | Naik |
| 2008/0044990 A1 | 2/2008 | Lee |
| 2008/0050538 A1 | 2/2008 | Hirata |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102570 A1 | 5/2008 | Fischer et al. |
| 2008/0102640 A1 | 5/2008 | Hassan et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142831 A1 | 6/2008 | Su |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0202688 A1 | 8/2008 | Wu et al. |
| 2008/0202892 A1 | 8/2008 | Smith et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1* | 10/2008 | Aramaki ............ H01J 37/32192 156/345.43 |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0036292 A1 | 2/2009 | Sun et al. |
| 2009/0045167 A1 | 2/2009 | Maruyama |
| 2009/0072401 A1 | 3/2009 | Arnold et al. |
| 2009/0081878 A1* | 3/2009 | Dhindsa ............ H01J 37/32091 438/729 |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120464 A1 | 5/2009 | Rasheed et al. |
| 2009/0162647 A1 | 6/2009 | Sun et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0191711 A1 | 7/2009 | Rui et al. |
| 2009/0194233 A1 | 8/2009 | Tamura |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0214825 A1 | 8/2009 | Sun et al. |
| 2009/0223928 A1 | 9/2009 | Colpo |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1* | 11/2009 | Lubomirsky ....... C23C 16/4405 156/345.34 |
| 2009/0277874 A1 | 11/2009 | Rui et al. |
| 2009/0280650 A1* | 11/2009 | Lubomirsky ............ B08B 7/00 438/694 |
| 2009/0286400 A1 | 11/2009 | Heo et al. |
| 2009/0317978 A1 | 11/2009 | Higashi |
| 2009/0293809 A1 | 12/2009 | Cho et al. |
| 2009/0294898 A1 | 12/2009 | Feustel et al. |
| 2009/0320756 A1 | 12/2009 | Tanaka |
| 2010/0000683 A1 | 1/2010 | Kadkhodayan et al. |
| 2010/0003824 A1 | 1/2010 | Kadkhodayan et al. |
| 2010/0022030 A1 | 1/2010 | Ditizio |
| 2010/0025370 A1 | 2/2010 | Dieguez-Campo et al. |
| 2010/0039747 A1 | 2/2010 | Sansoni |
| 2010/0047080 A1 | 2/2010 | Bruce |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0081285 A1 | 4/2010 | Chen et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |

(56) References Cited

U.S. PATENT DOCUMENTS

| | | |
|---|---|---|
| 2010/0119843 A1 | 5/2010 | Sun et al. |
| 2010/0129974 A1 | 5/2010 | Futase et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0224324 A1 | 9/2010 | Kasai |
| 2010/0240205 A1 | 9/2010 | Son |
| 2010/0243606 A1 | 9/2010 | Koshimizu |
| 2010/0252068 A1 | 10/2010 | Kannan et al. |
| 2010/0258913 A1 | 10/2010 | Lue |
| 2010/0267224 A1 | 10/2010 | Choi et al. |
| 2010/0267248 A1 | 10/2010 | Ma et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0330814 A1 | 12/2010 | Yokota et al. |
| 2011/0005607 A1 | 1/2011 | Desbiolles et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0045676 A1 | 2/2011 | Park |
| 2011/0048325 A1 | 3/2011 | Choie et al. |
| 2011/0053380 A1 | 3/2011 | Sapre et al. |
| 2011/0058303 A1 | 3/2011 | Migita |
| 2011/0061810 A1* | 3/2011 | Ganguly ............ H01L 21/0223 156/345.27 |
| 2011/0061812 A1* | 3/2011 | Ganguly ............ H01L 21/0223 156/345.34 |
| 2011/0065276 A1* | 3/2011 | Ganguly ............ H01L 21/0223 438/694 |
| 2011/0076401 A1 | 3/2011 | Chao et al. |
| 2011/0081782 A1 | 4/2011 | Liang et al. |
| 2011/0100489 A1 | 5/2011 | Orito |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1* | 7/2011 | Honda ................ C23C 16/509 423/446 |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0207332 A1 | 8/2011 | Liu et al. |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0256421 A1 | 10/2011 | Bose et al. |
| 2011/0265884 A1 | 11/2011 | Xu et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0294300 A1 | 12/2011 | Zhang et al. |
| 2011/0298061 A1 | 12/2011 | Siddiqui et al. |
| 2011/0304078 A1 | 12/2011 | Lee et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1* | 2/2012 | Dhindsa ............ H01J 37/32091 156/345.26 |
| 2012/0034786 A1* | 2/2012 | Dhindsa ............ C23C 16/4412 438/710 |
| 2012/0035766 A1 | 2/2012 | Shajii et al. |
| 2012/0037596 A1 | 2/2012 | Eto et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0091108 A1 | 4/2012 | Lin et al. |
| 2012/0097330 A1 | 4/2012 | Iyengar et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0238102 A1* | 9/2012 | Zhang ............ H01J 37/32422 438/718 |
| 2012/0238103 A1* | 9/2012 | Zhang ............ H01J 37/32422 438/720 |
| 2012/0241411 A1 | 9/2012 | Darling et al. |
| 2012/0247390 A1* | 10/2012 | Sawada ............ C23C 16/4412 118/723 AN |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0258600 A1 | 10/2012 | Godet et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1* | 11/2012 | Tan ................ H01J 37/32357 156/345.31 |
| 2012/0292664 A1 | 11/2012 | Kanike |
| 2012/0304933 A1 | 12/2012 | Mai et al. |
| 2012/0309204 A1 | 12/2012 | Kang et al. |
| 2012/0309205 A1 | 12/2012 | Wang et al. |

(56) References Cited

U.S. PATENT DOCUMENTS

| | | |
|---|---|---|
| 2012/0322015 A1 | 12/2012 | Kim |
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023124 A1 | 1/2013 | Nemani et al. |
| 2013/0026135 A1 | 1/2013 | Kim |
| 2013/0032574 A1* | 2/2013 | Liu .................. H01J 37/32091 216/67 |
| 2013/0034666 A1* | 2/2013 | Liang ............... H01J 37/32357 427/569 |
| 2013/0034968 A1* | 2/2013 | Zhang ................ H01L 21/3065 438/718 |
| 2013/0037919 A1 | 2/2013 | Sapra et al. |
| 2013/0045605 A1* | 2/2013 | Wang ............... H01L 21/31116 438/723 |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0062675 A1 | 3/2013 | Thomas |
| 2013/0065398 A1 | 3/2013 | Ohsawa et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130507 A1 | 5/2013 | Wang et al. |
| 2013/0150303 A1 | 6/2013 | Kungl et al. |
| 2013/0161726 A1 | 6/2013 | Kim et al. |
| 2013/0171810 A1 | 7/2013 | Sun et al. |
| 2013/0175654 A1 | 7/2013 | Muckenhirn et al. |
| 2013/0187220 A1 | 7/2013 | Surthi |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0279066 A1 | 10/2013 | Lubomirsky et al. |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0286530 A1 | 10/2013 | Lin et al. |
| 2013/0295297 A1* | 11/2013 | Chou ................ C23C 16/45565 427/569 |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1* | 1/2014 | Kim .................. H01J 37/32091 134/1.1 |
| 2014/0021673 A1 | 1/2014 | Chen et al. |
| 2014/0026813 A1 | 1/2014 | Wang et al. |
| 2014/0053866 A1 | 2/2014 | Baluja et al. |
| 2014/0057447 A1* | 2/2014 | Yang .................. H01L 21/3065 438/711 |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0102367 A1 | 4/2014 | Ishibashi |
| 2014/0124364 A1 | 5/2014 | Yoo et al. |
| 2014/0134847 A1 | 5/2014 | Seya |
| 2014/0141621 A1 | 5/2014 | Ren et al. |
| 2014/0147126 A1 | 5/2014 | Yamashita et al. |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0186772 A1 | 7/2014 | Pohlers et al. |
| 2014/0190410 A1 | 7/2014 | Kim |
| 2014/0191388 A1 | 7/2014 | Chen |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0227881 A1* | 8/2014 | Lubomirsky ..... H01J 37/32357 438/710 |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh et al. |
| 2014/0308758 A1 | 10/2014 | Nemani et al. |
| 2014/0308816 A1 | 10/2014 | Wang et al. |
| 2014/0311581 A1* | 10/2014 | Belostotskiy ..... H01L 21/67253 137/14 |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0152072 A1 | 6/2015 | Cantat et al. |

(56) References Cited

U.S. PATENT DOCUMENTS

| | | |
|---|---|---|
| 2015/0155177 A1 | 6/2015 | Zhang et al. |
| 2015/0170879 A1* | 6/2015 | Nguyen ............ H01J 37/32091 216/67 |
| 2015/0170920 A1 | 6/2015 | Purayath et al. |
| 2015/0170924 A1* | 6/2015 | Nguyen ............ H01J 37/3244 438/710 |
| 2015/0170926 A1 | 6/2015 | Michalak |
| 2015/0170935 A1 | 6/2015 | Wang et al. |
| 2015/0170943 A1* | 6/2015 | Nguyen ............ H01L 21/3065 438/710 |
| 2015/0171008 A1 | 6/2015 | Luo |
| 2015/0179464 A1 | 6/2015 | Wang et al. |
| 2015/0187625 A1 | 7/2015 | Busche et al. |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214337 A1* | 7/2015 | Ko .................... H01L 29/66795 438/478 |
| 2015/0221541 A1 | 8/2015 | Nemani et al. |
| 2015/0235809 A1* | 8/2015 | Ito .................... H01J 37/32165 156/345.48 |
| 2015/0235860 A1 | 8/2015 | Tomura et al. |
| 2015/0235863 A1 | 8/2015 | Chen |
| 2015/0235865 A1* | 8/2015 | Wang .................... H01L 21/324 438/704 |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0340225 A1 | 11/2015 | Kim et al. |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0380431 A1 | 12/2015 | Kanamori et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042968 A1 | 2/2016 | Purayath et al. |
| 2016/0056167 A1 | 2/2016 | Wang et al. |
| 2016/0064233 A1 | 3/2016 | Wang et al. |
| 2016/0079072 A1 | 3/2016 | Wang et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0104606 A1 | 4/2016 | Park et al. |
| 2016/0109863 A1 | 4/2016 | Valcore et al. |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0126118 A1 | 5/2016 | Chen et al. |
| 2016/0133480 A1 | 5/2016 | Ko et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0196969 A1 | 7/2016 | Berry et al. |
| 2016/0196984 A1 | 7/2016 | Lill et al. |
| 2016/0204009 A1 | 7/2016 | Nguyen et al. |
| 2016/0218018 A1 | 7/2016 | Lieu et al. |
| 2016/0222522 A1 | 8/2016 | Wang et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240389 A1 | 8/2016 | Zhang et al. |
| 2016/0240402 A1 | 8/2016 | Park et al. |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293438 A1 | 10/2016 | Zhou et al. |
| 2016/0307772 A1 | 10/2016 | Choi et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0343548 A1 | 11/2016 | Howald et al. |
| 2017/0040175 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0062184 A1 | 3/2017 | Tran et al. |
| 2017/0110290 A1 | 4/2017 | Kobayashi et al. |
| 2017/0110475 A1 | 4/2017 | Liu et al. |
| 2017/0178924 A1 | 6/2017 | Chen et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1 | 8/2017 | Liang et al. |
| 2017/1042703 | 8/2017 | Liang et al. |
| 2017/0309509 A1 | 10/2017 | Tran et al. |
| 2017/0338133 A1 | 11/2017 | Tan et al. |
| 2017/0338134 A1 | 11/2017 | Tan et al. |
| 2018/0005850 A1 | 1/2018 | Citla et al. |

FOREIGN PATENT DOCUMENTS

| | | |
|---|---|---|
| CN | 1847450 A | 10/2006 |
| CN | 101236893 A | 8/2008 |
| CN | 101378850 A | 3/2009 |
| EP | 1675160 A1 | 6/2006 |
| JP | S59-126778 A | 7/1984 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | 2001-313282 A | 11/2001 |
| JP | 2001-332608 A | 11/2001 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |

(56) References Cited

FOREIGN PATENT DOCUMENTS

| | | | |
|---|---|---|---|
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 2003-0023964 A | 3/2003 |
| KR | 10-2003-0054726 A | 7/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |
| KR | 10-2009-0040869 A | 4/2009 |
| KR | 10-2009-0128913 A | 12/2009 |
| KR | 10-2010-0013980 A | 2/2010 |
| KR | 10-2010-0093358 A | 5/2010 |
| KR | 10-2011-0086540 A | 7/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2008-112673 A2 | 9/2008 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011-095846 A1 | 8/2011 |
| WO | 2011-149638 A | 12/2011 |
| WO | 2012-050321 A | 4/2012 |
| WO | 2012-118987 A1 | 9/2012 |
| WO | 2012-125656 A2 | 9/2012 |
| WO | 2013-118260 A1 | 8/2013 |

OTHER PUBLICATIONS

International Search Report and Written Opinion of PCT/US2016/045543 dated Nov. 17, 2016, all pages.
H. Xiao, Introduction to Semiconductor Manufacturing Technology, published by Prentice Hall, 2001, ISBN 0-13-022404-9, pp. 354-356.
Manual No. TQMA72E1. "Bayard-Alpert Pirani Gauge FRG-730: Short Operating Instructions" Mar. 2012. Agilent Technologies, Lexington, MA 02421, USA. pp. 1-45.
International Search Report and Written Opinion of PCT/US2017/047209 dated Nov. 24, 2017, all pages.
International Search Report and Written Opinion of PCT/US2017/033362 dated Aug. 24, 2017, all pages.
Instrument Manual: Vacuum Gauge Model MM200, Rev D. TELEVAC (website: www.televac.com), A Division of the Fredericks Company, Huntingdon Valley, PA, US. 2008. pp. 162.
"Liang et al. Industrial Application of Plasma Process vol. 3, pp. 61-74, 2010".
J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).
International Search Report and Written Opinion of PCT/US2017/060696 dated Jan. 25, 2018, all pages.
International Search Report and Written Opinion of PCT/US2017/055431 dated Jan. 19, 2018, all pages.
Won et al. Derwent 2006-065772; Sep. 7, 2014, 10 pages.

* cited by examiner

SEMICONDUCTOR PROCESSING WITH DC ASSISTED RF POWER FOR IMPROVED CONTROL

CROSS-REFERENCES TO RELATED APPLICATIONS

This application is a divisional of, and claims benefit to, U.S. patent application Ser. No. 13/829,669, filed Mar. 14, 2013. This application also claims the benefit of U.S. Provisional Application No. 61/678,964, filed Aug. 2, 2012, entitled "Semiconductor Processing With DC Assisted RF Power for Improved Control." The entire disclosures of both applications are hereby incorporated by reference for all purposes.

TECHNICAL FIELD

The present technology relates to semiconductor processes and equipment. More specifically, the present technology relates to processing system plasma components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Dry etches produced in local plasmas formed within the substrate processing region can penetrate more constrained trenches and exhibit less deformation of delicate remaining structures. However, as integrated circuit technology continues to scale down in size, the equipment that delivers the precursors can impact the uniformity and quality of the precursors and plasma species used, and the formation and profile of the plasma may also affect the quality of film deposition and etching.

Thus, there is a need for improved system components that can be used in plasma environments effectively to provide improved control over plasma and plasma characteristics. These and other needs are addressed by the present technology.

SUMMARY

Semiconductor processing systems are described including a process chamber. The process chamber may include a lid assembly, grid electrode, conductive insert, and ground electrode. Each component may be coupled with one or more power supplies operable to produce a plasma within the process chamber. Each component may be electrically isolated through the positioning of a plurality of insulation members. The one or more power supplies may be electrically coupled with the process chamber with the use of switching mechanisms. The switches may be switchable to electrically couple the one or more power supplies to the components of the process chamber.

An exemplary processing system may include a processing chamber that includes a lid assembly defining a precursor inlet through which precursor species may be delivered. The chamber may also include a ground electrode and a grid electrode disposed between the lid assembly and the ground electrode, and defining a first plasma region within the chamber between the grid electrode and the lid assembly and a second plasma region within the chamber between the grid electrode and the ground electrode. The chamber may also include a conductive insert disposed between the lid assembly and the grid electrode at a periphery of the first plasma region. The chamber may further include an insulation member positioned to electrically isolate the grid electrode from the conductive insert. The processing system may also include a first power supply electrically coupled with the lid assembly, and a second power supply electrically coupled with at least one of the lid assembly, the grid electrode, or the conductive insert.

A switch such as a first switch may be electrically coupled with the second power supply. The switch may be switchable to electrically couple the second power supply to one of the lid assembly, the grid electrode, or the conductive insert, among other conductive portions of the processing chamber. The processing system may additionally include a second switch that is switchable to electrically couple at least two of the lid assembly, the ground electrode, or the grid electrode such that an electrical potential applied to one of the coupled structures will be applied to both of the coupled structures. The processing system may have the first switch switched to electrically couple the second power supply with the conductive insert. The second switch may also be switched to electrically couple the grid electrode and the ground electrode.

Additionally, the second power supply may be configured to deliver a negative voltage to the conductive insert, and the first power supply may be configured to ignite a plasma in the first plasma region where electron flux is directed to the grid electrode. The second power supply may also be configured to deliver a positive voltage to the conductive insert, and the first power supply may be configured to ignite a plasma in the first plasma region where ion flux is directed to the grid electrode. The first switch may also be switched to electrically couple the second power supply with the lid assembly such that both the first and second power supplies are electrically coupled with the lid assembly. The second switch may also be switched to electrically couple the grid electrode and the ground electrode. The second power supply may also be configured to provide constant voltage to the lid assembly, and the first power supply may be configured to provide pulsed frequency power to the lid assembly.

The processing system may also be configured where the first switch may be switched to electrically couple the second power supply with the lid assembly such that both the first and second power supplies are electrically coupled with the lid assembly, and the second switch may be switched to electrically couple the grid electrode and the lid assembly. The second power supply may also be configured to provide constant voltage to the lid assembly, and the first power supply may be configured to provide pulsed frequency power to the lid assembly. Also, the first switch may be switched to electrically couple the second power supply with the grid electrode. In another arrangement, the second power supply may be configured to provide constant voltage to the grid electrode, and the first power supply may be configured to provide pulsed frequency power to the lid assembly. In disclosed embodiments the first power supply may be an RF power supply, and the second power supply may be a DC power supply.

Methods of producing a plasma in a semiconductor processing chamber are also described, and may include coupling a first power supply with the processing chamber lid assembly to form a plasma within the processing chamber. The methods may also include coupling a second power supply with the processing chamber, and tuning the plasma with the second power supply. The tuning may include a variety of operations including applying a negative voltage with the second power supply to increase the electron flux. Also, the tuning may include applying a positive voltage with the second power supply to increase the ion flux.

The methods may include electrically coupling the second power supply with a switch that may be switchably coupled with multiple conductive sections of the processing chamber. In one example, the second power supply may be switched to be coupled with the lid assembly. The methods may include operating the first power supply so that it provides pulsing power to the lid assembly. The methods may also include utilizing an RF power supply for the first power supply, and a DC power supply for the second power supply.

Such technology may provide numerous benefits over conventional equipment. For example, tunable plasmas may allow increased control over plasma profiles being used in processing operations. Additionally, by adjusting the ion/electron flux profile, etching operations may be tuned in situ as processes are being performed. These and other embodiments, along with many of their advantages and features, are described in more detail in conjunction with the below description and attached figures.

BRIEF DESCRIPTION OF THE DRAWINGS

A further understanding of the nature and advantages of the present technology may be realized by reference to the remaining portions of the specification and the drawings.

In the appended figures, similar components and/or features may have the same reference label. Further, various components of the same type may be distinguished by following the reference label with a letter that distinguishes among the similar components and/or features. If only the first reference label is used in the specification, the description is applicable to any one of the similar components having the same first reference label irrespective of the letter suffix.

DETAILED DESCRIPTION

Systems and methods are described for the generation and/or control of a plasma inside a semiconductor processing chamber. The plasma may originate inside the processing chamber, outside the processing chamber in a remote plasma unit, or both. Inside the chamber, the plasma is contained and may be separated from a substrate wafer with the use of power supplies electrically coupled with components of the processing chamber that may serve as electrodes. In some instances, the components may also function as part of a gas/precursor distribution system and may include a suppressor and/or a showerhead, as well as other components of the processing system. In additional instances, the components may function to define a partition between a plasma generation region and a gas reaction region that etches and/or deposits material on exposed surfaces of the substrate wafer.

The present technology includes improved power and control schemes for plasma modulation within a semiconductor process chamber. While conventional plasma generation may simply provide an internal plasma with limited tuning, the presently described technology may allow for improved control and modulation of etching chemistries via plasma manipulation. In so doing, etching depths, profiles, and selectivities may be adjusted as required for a variety of operational conditions.

Exemplary processing system configurations include one or more power supplies that are used as part of a capacitively coupled plasma ("CCP") system. In some embodiments, an RF power supply may be electrically coupled with one portion of the processing chamber, while a DC power supply may be coupled with the same or a different portion of the processing chamber. The DC power supply may allow for a plasma within the processing chamber to be sustained during cycling of the RF power supply, along with manipulation of the generated plasma. The manipulation may include adjusting the specific etch chemistry directed to the substrate wafer or chamber post, the ion flux directed to the substrate wafer or chamber post, as well as the functional capabilities of the ions utilized.

Figure 1:
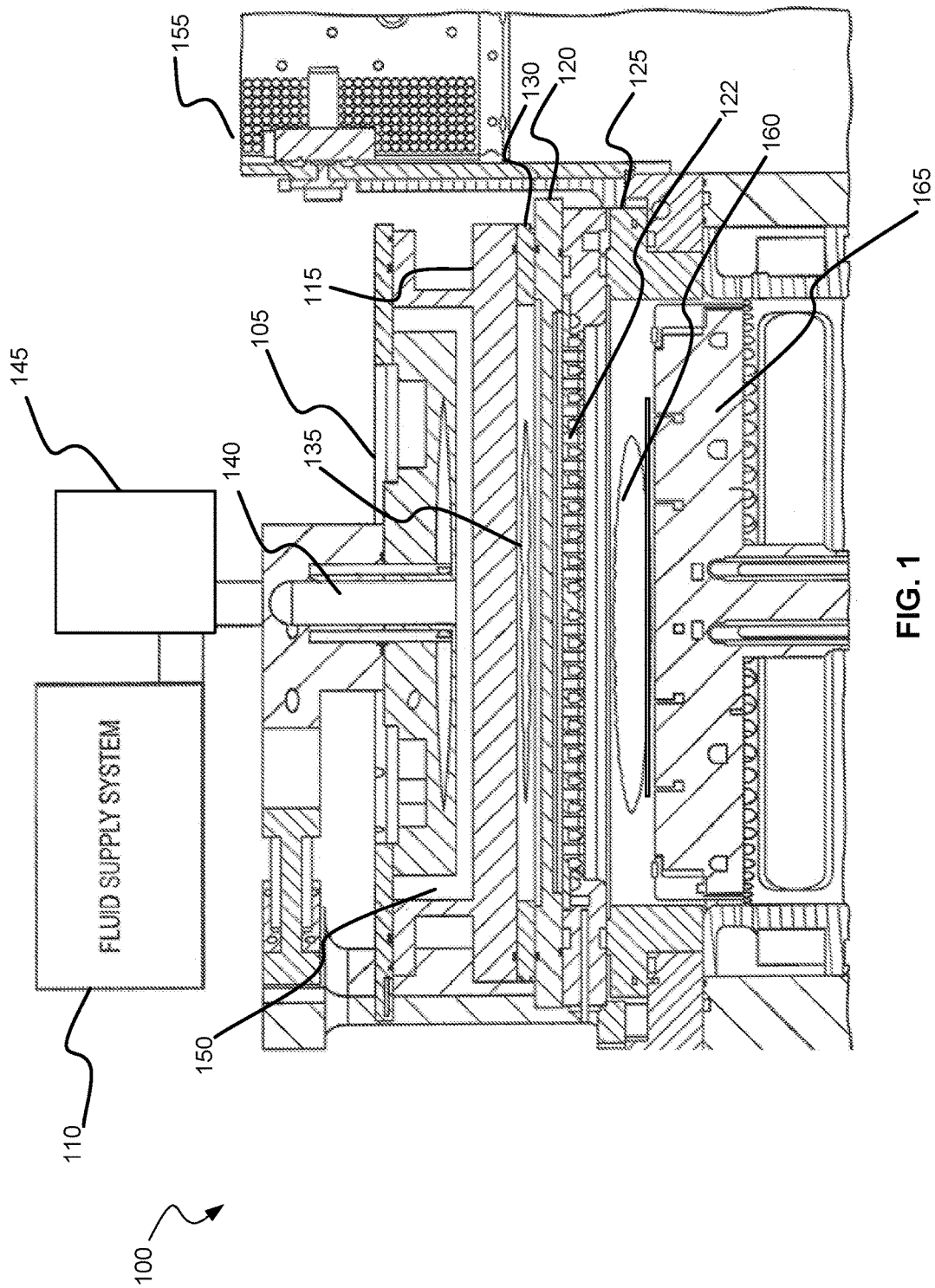
FIG. 1 shows a simplified cross-sectional view of a processing system according to embodiments of the present technology.

FIG. 1 shows a simplified cross-sectional view of a processing system 100 according to embodiments of the present technology. The processing system may optionally include components located outside the processing chamber 105, such as fluid supply system 110. The processing chamber 105 may hold an internal pressure different than the surrounding pressure. For example, the pressure inside the processing chamber may be about 10 mTorr to about 20 Torr during processing.

The CCP system may be composed of several of the processing chamber components, and may function to generate a plasma inside the processing chamber 105. The components of the CCP system may include a lid assembly or hot electrode 115 that may be composed of several components including a gas box, a blocker, and a faceplate. These components may be directly or indirectly coupled mechanically in order to function as a single electrode. The CCP system also may include a grid electrode 120 that also may be composed of one or more chamber components. For example, the grid electrode 120 may be composed of an ion suppressor or blocker and/or a manifold or showerhead for precursor delivery to the substrate wafer. Again, the components may be electrically coupled with each other in order to function as a single electrode. The CCP system may also include a ground electrode 125 that may include one or more chamber components including a lid spacer.

In some embodiments, the lid 115 and grid electrode 120 are electrically conductive electrodes that can be electrically biased with respect to each other to generate an electric field strong enough to ionize gases between the electrodes into a plasma. An electrical insulator 130 may separate the lid 115 and the grid 120 electrodes to prevent them from short-circuiting when a plasma is generated. The electrical insulator 130 may include multiple layers of material, as will be explained in more detail below with regard to the embodiments discussed with FIG. 2, and may alternatively include additional electrode layers. The plasma exposed surfaces of the lid 115, insulator 130, and grid electrode 120 may define a plasma excitation region 135 in the processing chamber 105.

Plasma generating gases may travel from a gas supply system 110 through a gas inlet 140 into the plasma excitation region 135. The plasma generating gases may be used to strike a plasma in the excitation region 135, or may maintain a plasma that has already been formed. In some embodiments, the plasma generating gases may have already been at least partially converted into plasma excited species in a remote plasma system 145 positioned outside the processing chamber 105 before traveling downstream though the inlet 140 to the plasma excitation region 135. When the plasma excited species reach the plasma excitation region 135, they may be further excited and affected by the characteristics of the plasma generated in the plasma excitation region. In some operations, the degree of added excitation provided by the CCP system may change over time depending on the substrate processing sequence and/or conditions.

The plasma generating gases and/or plasma excited species may pass through a plurality of holes (not shown) in lid 115 for a more uniform delivery into the plasma excitation region 135. Exemplary configurations include having the inlet 140 open into a gas supply region 150 partitioned from the plasma excitation region 135 by lid 115 so that the gases/species flow through the holes in the lid 115 into the plasma excitation region 135. Structural and operational features may be selected to prevent significant backflow of plasma from the plasma excitation region 135 back into the supply region 150, inlet 140, and fluid supply system 110. The structural features may include the selection of dimensions and cross-sectional geometry of the holes in lid 115 that deactivates back-streaming plasma. The operational features may include maintaining a pressure difference between the gas supply region 150 and plasma excitation region 135 that maintains a unidirectional flow of plasma through the grid electrode 120.

As noted above, the lid 115 and the grid electrode 120 may function as a first electrode and second electrode, respectively, so that the lid 115 and/or grid electrode 120 may receive an electric charge. In these configurations, electrical power such as RF power may be applied to the lid 115, grid electrode 120, or both. In one example, electrical power may be applied to the lid 115 while the grid electrode 120 is grounded. The substrate processing system 100 may include an RF generator 155 that provides electrical power to the lid 115 and/or one or more other components of the chamber 105. The electrically charged lid 115 may facilitate a uniform distribution of plasma, i.e., reduce localized plasma, within the plasma excitation region 135. To enable the formation of a plasma in the plasma excitation region 135, insulator 130 may electrically insulate lid 115 and grid electrode 120. Insulator 130 may be made from a ceramic and may have a high breakdown voltage to avoid sparking. In other embodiments discussed in more detail below, the insulator 130 includes several components that may be further utilized to affect the generated plasma, and may include additional electrode materials. The CCP system may also include a DC power system as will be described further below for modulating the RF generated plasma inside the chamber. The CCP system may further include a cooling unit (not shown) that includes one or more cooling fluid channels to cool surfaces exposed to the plasma with a circulating coolant (e.g., water). The cooling unit may include jacketing coupled with the exterior of the chamber 105 walls, as well as channels defined within the interior of the chamber walls that circulate a temperature controlled fluid.

The grid electrode 120 may include a plurality of holes 122 that suppress the migration of ionically-charged species out of the plasma excitation region 135 while allowing uncharged neutral or radical species to pass through the grid electrode 120. These uncharged species may include highly reactive species that are transported with less reactive carrier gas through the holes 122. As noted above, the migration of ionic species through the holes 122 may be reduced, and in some instances completely suppressed. Controlling the amount of ionic species passing through the grid electrode 120 may provide increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., SiOx:SiNx etch ratios, Poly-Si:SiOx etch ratios, etc.), as well as shift the balance of conformal-to-flowable of a deposited dielectric material. These features will be explained in more detail below.

The plurality of holes 122 may be configured to control the passage of the activated gas (i.e., the ionic, radical, and/or neutral species) through the grid electrode 120. For example, the aspect ratio of the holes 122 (i.e., the hole diameter to length) and/or the geometry of the holes 122 may be controlled so that the flow of ionically-charged species in the activated gas passing through the grid electrode 120 is reduced. In embodiments where the grid electrode includes an electrically coupled ion suppressor and showerhead, the holes in the ion blocker, which may be disposed above the showerhead, may include a tapered portion that faces the plasma excitation region 135, and a cylindrical portion that faces the showerhead. The cylindrical portion may be shaped and dimensioned to control the flow of ionic species passing to the showerhead. An adjustable electrical bias may also be applied to the grid electrode 120 as an additional means to control the flow of ionic species through the electrode.

Depending on whether a deposition or an etching process is performed, gases and plasma excited species may pass through the grid electrode 120 and be directed to the substrate. The showerhead, which may be a component included in the grid electrode, can further direct the flow of gases or plasma species. The showerhead may be a dual-zone showerhead that may include multiple fluid channels for directing the flow of one or more gases. The dual-zone showerhead may have a first set of channels to permit the passage of plasma excited species into reaction region 160, and a second set of channels that deliver a second gas/precursor mixture into the reaction region 160.

A fluid delivery source may be coupled with the showerhead to deliver a precursor that is able to bypass plasma excitation region 135 and enter reaction region 160 from within the showerhead through the second set of channels. The second set of channels in the showerhead may be fluidly coupled with a source gas/precursor mixture (not shown) that is selected for the process to be performed. For example, when the processing system is configured to perform an etch on the substrate surface, the source gas/precursor mixture may include etchants such as oxidants, halogens, water vapor and/or carrier gases that mix in the reaction region 160 with plasma excited species distributed from the first set of channels in the showerhead. Excessive ions in the plasma excited species may be reduced as the species move through the holes 122 in the grid electrode 120, and reduced further as the species move through channels in the showerhead.

The processing system may still further include a pedestal 165 that is operable to support and move the substrate or wafer. The distance between the pedestal 165 and the bottom of the grid electrode 120 help define the reaction region 160 along with lid spacer 125 defining the periphery of the reaction region 160. The pedestal 165 may be vertically or axially adjustable within the processing chamber 105 to increase or decrease the reaction region 160 and affect the deposition or etching of the wafer substrate by repositioning the wafer substrate with respect to the gases passed through the grid electrode 120. The pedestal 165 may have a heat exchange channel through which a heat exchange fluid flows to control the temperature of the wafer substrate. Circulation of the heat exchange fluid allows the substrate temperature to be maintained at relatively low temperatures (e.g., about −20° C. to about 90° C.). Exemplary heat exchange fluids include ethylene glycol and water.

The pedestal 165 may also be configured with a heating element such as a resistive heating element to maintain the substrate at heating temperatures (e.g., about 90° C. to about 1100° C.). Exemplary heating elements may include a single-loop heater element embedded in the substrate support platter that makes two or more full turns in the form of parallel concentric circles. An outer portion of the heater element may run adjacent to a perimeter of the support platten, while an inner portion may run on the path of a concentric circle having a smaller radius. The wiring to the heater element may pass through the stem of the pedestal.

A dual-zone showerhead, as well as the processing system and chamber, are more fully described in patent application Ser. No. 13/251,714 filed on Oct. 3, 2011, which is hereby incorporated by reference for all purposes to the extent not inconsistent with the claimed features and description herein.

Figure 2:
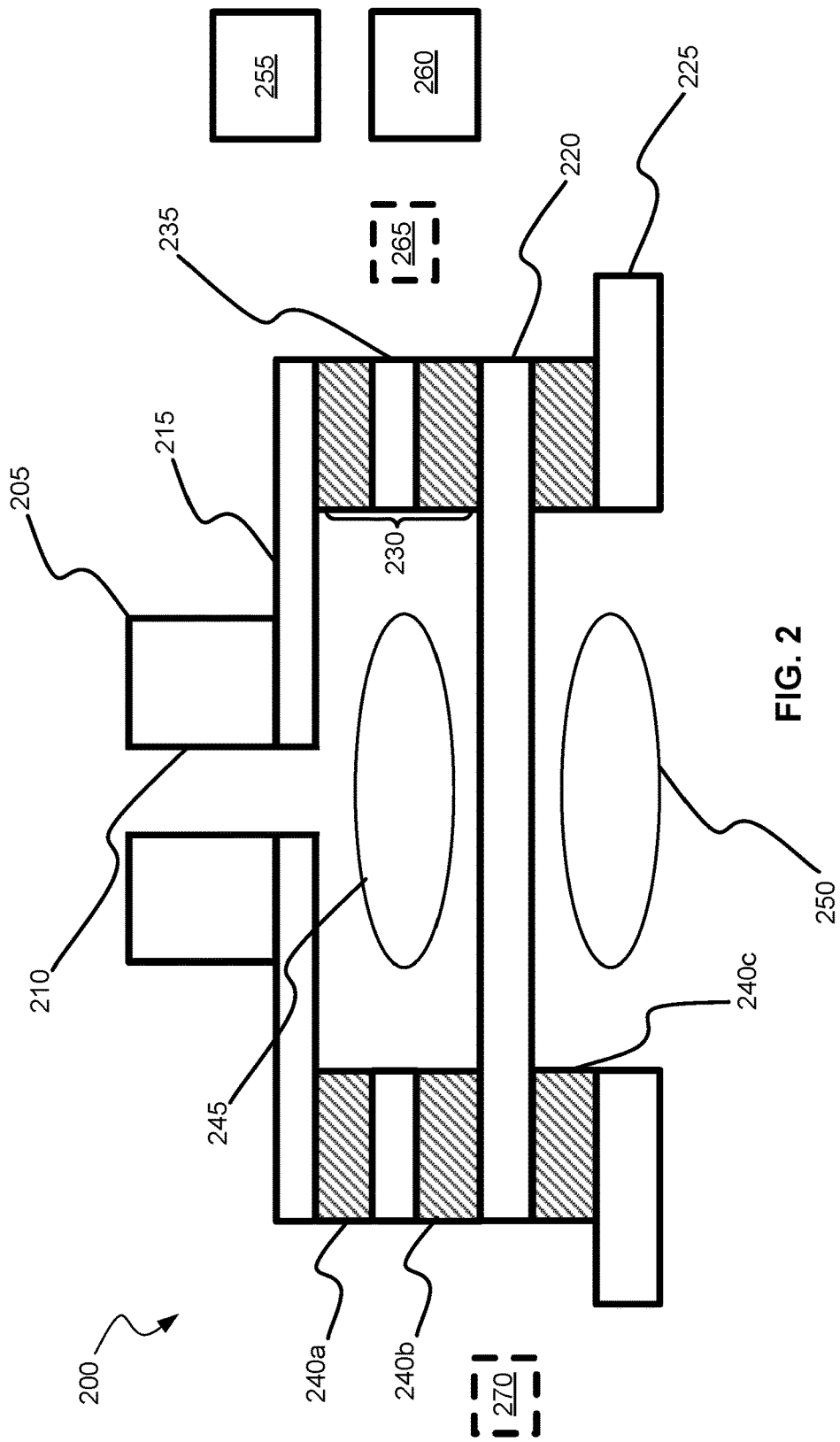
FIG. 2 shows a simplified cross-sectional view of a processing chamber assembly according to embodiments of the present technology.

FIG. 2 shows a simplified cross-sectional schematic of a processing chamber assembly according to embodiments of the present technology. The schematic illustrates a portion of a processing chamber 205 that may be used in semiconductor fabrication processes. Chamber 205 may be similar to processing chamber 105 as shown in FIG. 1. Chamber 205 may include a lid assembly 215 that may in some aspects be comparable to the lid assembly 115 as shown in FIG. 1. For example, lid assembly 215 may define precursor inlet 210, through which a precursor species may be delivered. A remote plasma unit (not shown) may be fluidly coupled with the precursor inlet 210 to provide radical precursor species into processing chamber 205. The radical precursor provided by the plasma unit may be mixed with additional gases inside the processing chamber 205 that are separately flowed into the chamber 205 through alternate channels (not shown).

Processing chamber 205 may include a grid electrode 220 that may include one or more chamber components electrically coupled. The grid electrode 220 may include one or more manifolds, and may include an ion blocker, as well as a showerhead, such as a dual-zone showerhead as previously described. The processing chamber 205 may include a ground electrode 225 that may be composed of additional chamber 205 components. For example, the ground electrode 225 may be a lid spacer or other wall component of the processing chamber 205. The ground electrode may alternatively include a ground connection to a substrate pedestal (not shown), but this may not be required for embodiments of the technology.

Processing chamber 205 may include an insulation section 230 similar to insulator 130 as illustrated in FIG. 1. However, as illustrated in processing chamber 205, insulation section 230 includes multiple components. The processing chamber 205 may include a conductive insert 235 disposed between lid assembly 215 and grid electrode 220. The conductive insert 235 may be a single piece of conductive material of an annular shape disposed as a portion of the chamber 205 wall.

A plurality of insulation members may additionally be incorporated into processing chamber 205 to electrically isolate the chamber components. For example, insulation members 240a-c are positioned between each of the conductive components and electrodes of the chamber housing. The insulation members 240 may be of a single annular shape, or be composed of several sections that when combined provide an electrical barrier between chamber components. For example, the insulation member may resist the flow of electrical charge, and may be of a material having a high dielectric strength. Exemplary insulation members include ceramic plates that may be annular in shape and disposed above and below components including the conductive insert 235. Multiple layers of the insulation members may be positioned in chamber 205 to further isolate components of the chamber. At least one of the plurality of insulation members may be positioned to electrically isolate the conductive insert 235 from the grid electrode 220. The insulation members may additionally isolate both the conductive insert 235 and the grid electrode 220 from the lid assembly 215 and the ground electrode 225. In this way, each conductive section may be electrically isolated from any other conductive section of the processing chamber 205.

The chamber components may define plasma regions within the processing chamber. A first plasma region 245 may be at least partially defined above and below by the lid assembly 215 and the grid electrode 220. The conductive insert may be disposed along the periphery of the first plasma region 245. A second plasma region 250 may be at least partially defined above by the grid electrode 220. The second plasma region 250 may be at least partially defined below by a substrate pedestal (not shown), that may be moveable vertically, axially, or both, to define the area in which the second plasma region 250 exists. The ground electrode 225 may be disposed along the periphery of the second plasma region 250, or may be utilized to produce a boundary at least partially defining the lower bounds of the second plasma region 250.

Power supplies 255, 260 and optionally electrical switches 265, 270 may be coupled with processing chamber 205 to produce a processing system 200 with plasma control. The optional switches may be used to electrically couple components of the system. For example, electrical switch 265 may be electrically coupled with power supply 260, alternatively with power supply 255 and 260, alternatively with power supply 255, or still alternatively with either power supply while an additional switch (not shown) is used to electrically couple the other power supply. In yet another alternative, the switches may be bypassed to directly couple each of the power supplies 255, 260 to portions of the processing chamber. The power supplies 255, 260 may be of any type of power useful in semiconductor manufacturing, and may include RF power supplies, DC power supplies, etc. Optional switch 270 may be used to electrically couple components of the processing chamber 205. For example, switch 270 may be switchable to electrically couple any two or more of the lid assembly 215, the conductive insert 235, the grid electrode 220, and the ground electrode 225. Alternatively, optional switch 270 may be bypassed to directly electrically couple one or more components of the processing chamber 205. The switches 265, 270 may provide additional functionality so that the type of plasma generated, and the location of the plasma may be adjusted at any time during processing operations. The optional switches 265, 270 and power supplies 255, 260 may additionally include remotely located controls to manipulate the settings of the components as will be described further below.

Figure 3:
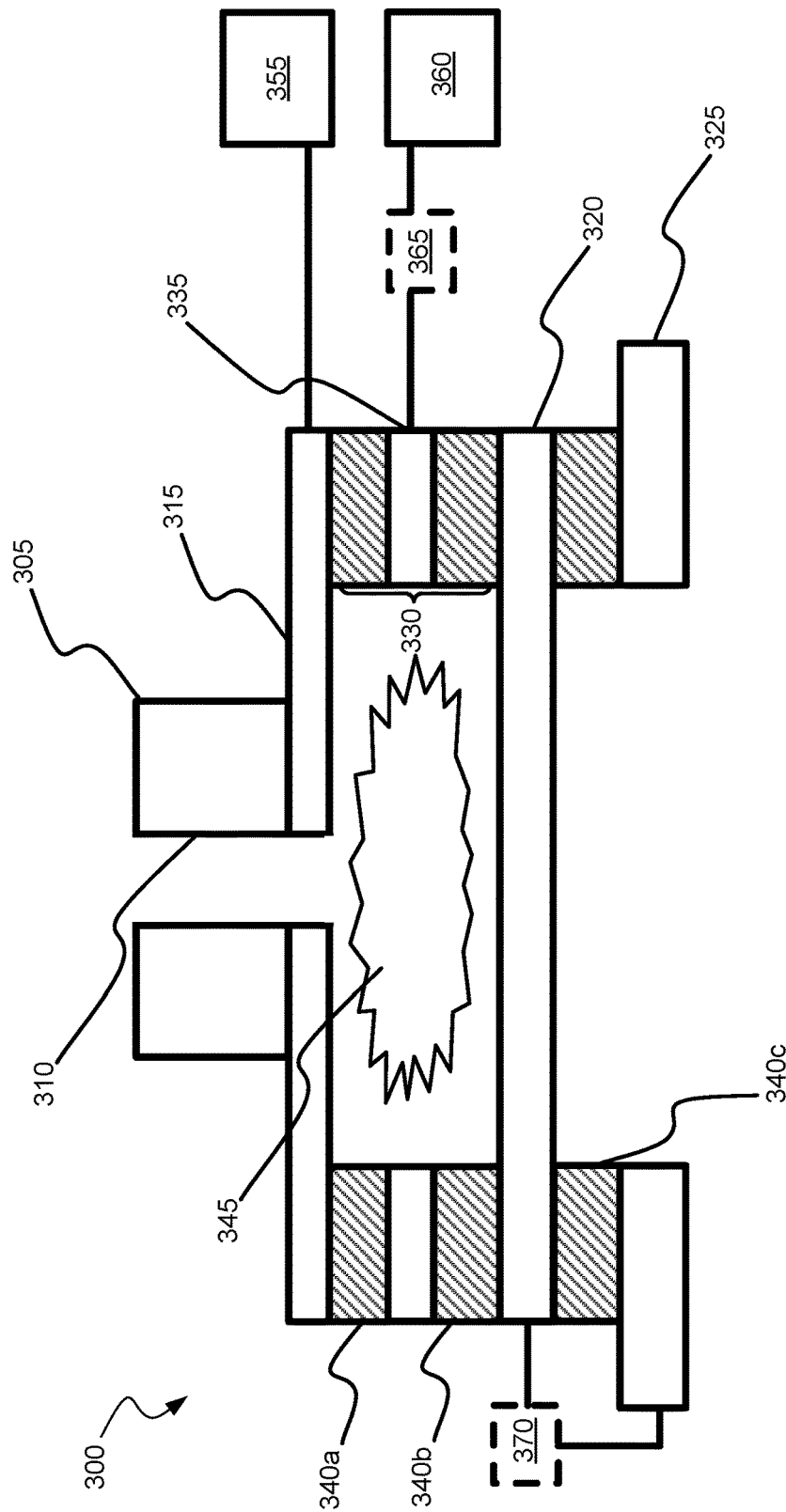
FIG. 3 shows a simplified cross-sectional view of a processing system having plasma generation components according to embodiments of the present technology.

FIG. 3 shows a simplified cross-sectional schematic of a processing system 300 having plasma generation components according to embodiments of the present technology. Chamber 305 of processing system 300 may include similar components as previously described with respect to FIG. 2. Chamber 305 may define a gas inlet 310 through which reactive precursor species may be delivered from, for example, a remote plasma unit (not shown). Chamber 305 may include a lid assembly 315, conductive insert 335, grid electrode 320, and ground electrode 325 along with additional chamber components. One or more of the lid assembly 315, conductive insert 335, grid electrode 320, and ground electrode 325 may be electrically isolated from the other listed components by one or more of a plurality of insulation members 340a-c. System 300 may additionally include power supplies 355, 360 as well as optional switches 365, 370 for electrically coupling the power supplies to the chamber, or components in the chamber to one another.

As illustrated in FIG. 3, power supply 355 may be electrically coupled with lid assembly 315. In some embodiments, power supply 355 is an RF power supply. When in operation, the power supply may provide an electrical charge to lid assembly 315 which may act as a hot electrode for plasma generation. Grid electrode 320 may be coupled with ground electrode 325 thereby defining a plasma region 345 in which plasma may be generated, or plasma conditions may be modulated. The grid electrode 320 may be directly coupled with ground electrode 325, or alternatively may be electrically isolated with insulation member 340c. The insulation may be overcome by electrically coupling the grid electrode 320 and the ground electrode 325. A conductive means may be used to electrically couple the electrodes, and an exemplary system may utilize optional switch 370 that is switchable for electrically coupling the components.

The RF power supply 355 may be configured to deliver an adjustable amount of power to the lid assembly 315 depending on the process performed. Exemplary power supplies may be configured to deliver an adjustable amount of power over a range of from 0 to about 3 kW of power. In deposition processes for example, the power delivered to the lid assembly 315 may be adjusted to set the conformality of the deposited layer. Deposited dielectric films are typically more flowable at lower plasma powers and shift from flowable to conformal when the plasma power is increased. For example, an argon containing plasma maintained in the plasma excitation region 345 may produce a more flowable silicon oxide layer as the plasma power is decreased from about 1000 Watts to about 100 Watts or lower (e.g., about 900, 700, 500, 300, 200, 100, 50, 25 Watts, or less), and a more conformal layer as the plasma power is increased from about 1000 Watts, or more (e.g., about 1200, 1500, 1800, 2000, 2200, 2400, 2600, 2800 Watts, or more). As the plasma power increases from low to high, the transition from a flowable to conformal deposited film may be relatively smooth and continuous or progress through relatively discrete thresholds. The plasma power (either alone or in addition to other deposition parameters) may be adjusted to select a balance between the conformal and flowable properties of the deposited film. For etching processes, reducing the power from 3 kW down below 1 kW or less can affect the removal rate of material being etched, and may reduce the rate at which deposited films are removed. Increasing the power above 1 kW and up to 3 kW can produce higher removal rates of deposited films.

Alternatively, for exemplary etch processes, the frequency and duty cycle of the RF power may be adjusted to modulate the chemistry and flux characteristics of the films. The inventors have also determined that certain frequencies of RF supply may affect the impact on chamber components, such as the grid electrode. A variety of frequencies may be employed, and during continuous operation of the RF power supply 355, frequencies such as up to about 400 kHz, between about 400 kHz and about 13.56 MHz, between about 13.56 MHz and about 60 MHz, and above 60 MHz may be employed. During certain operations, increasing the frequency may produce etchant radicals more efficiently, as well as reduce the damage caused to chamber components.

Power supply 360 may also be utilized during the operation of power supply 355, and may be a DC power supply in some embodiments. Exemplary DC power supplies may be configured for adjustable control between about 500 to about −500 V. Alternatively, power supply 360 may be configured for adjustable control between about 400 to about −400 V, between about 300 to about −300 V, between about 200 to about −200 V, between about 100 to about −100 V, etc., or less. Power supply 360 may be directly coupled with components of chamber 305, or electrically coupled to components with switch 365 that may be switchable to electrically couple power supply 360 to components of the chamber 305. In one embodiment, DC power supply 360 is electrically coupled with conductive insert 335.

RF power supply 355 and DC power supply 360 may be operated together, alternately, or in some other combination. In an exemplary operation, as illustrated in FIG. 3, RF power supply 355 may be operated continuously between about 0 and about 3000 kW to maintain a plasma in plasma reaction region 345. The DC power supply 360 may be unused or off, may be continuously operated, or alternatively may be pulsed during operation. The assistance of DC power may produce effects on the material being etched. For example, if the DC bias is positive, more ion flux from the plasma may move to the grid electrode, and subsequently to the substrate wafer. If the DC bias is negative, more electron flux may be directed to the grid electrode. By adjusting the bias as well as the power of the DC power supply 360, the etch characteristics of the plasma can be modulated. Accordingly, depending on the characteristics of the substrate or on the characteristics of the films being etched, the chemistry of the etchants may be adjusted to produce optimum etching results. For example, the more the etchant chemistry is adjusted to increase the ion or electron flux, the more the etchant fluids may be selective towards one or more deposited films. By combining the DC power supply 360 with the RF power supply 355, more chemistry modulation may be obtained as compared to an RF power supply alone. With the enhanced etchant chemistry modulation, improved etching selectivities may be obtained, which may also provide improved ability for more sensitive removals of deposited films. Sensitivity with removal rates may allow less material to be removed overall, which may allow less material to be deposited initially.

An alternative operational scheme as illustrated by FIG. 3 includes pulsing of the RF power supply 355 along with continuous or pulsed operation of the DC power supply 360. The RF power supply 355 may be configured to provide continuous adjustable modulation of RF pulsing from continuous wave down to about 1000 kHz or more. Alternatively, the RF may be adjusted in discrete increments from continuous wave to about 0.01 kHz, or alternatively about 0.1 kHz, 1 kHz, 10 kHz, 100 kHz, 1000 kHz, etc., or more. In still other embodiments, the RF power supply 355 may be pulsed in any variety or range of values between the listed values.

Alternatively or simultaneously, the duty cycle may be modulated. Adjusting the duty cycle, or the time in the active state, for the RF power supply may affect the flux of ions produced in the plasma. For example, when a reduction in the duty cycle occurs, a relatively or substantially commensurate reduction in ion current may be produced. During etching processes, by reducing the ion current, the etching rate may be reduced proportionately. However, when an RF power supply is cycled, it is switched on and off during the cycling time. When the RF power is cycled off, the generated plasma may dissipate. Accordingly, the amount of duty cycle reduction may conventionally have been limited to the times that may allow the plasma to be maintained at a certain level. However, the inventors have determined that with configurations such as those described here, the DC power supply 360 may be capable of adjusting the chemistry by maintaining ion and electron movement during the periods that the RF power is off. Additionally, by having a certain amount of DC power during the periods when the RF power is off, the plasma may be at least partially sustained by the DC power. In this way, the plasma may not fully dissipate when the RF power is cycled off. This may allow further adjustment of the chemistry because the etchant chemistry may adjust when the RF power is switched from on to off. By utilizing the DC power supply 360 during some or all of the on and/or off times of the RF power supply 355, the etchant chemistries may be further modified. Accordingly, further adjustment of the RF power may be acceptable with reduced duty cycles. As such, the duty cycle of the RF power may be operated from about 100% to about 0% during operation, less than or about 75%, less than or about 50%, or less than or about 25%. Alternatively, the duty cycle may be operated at about 90%, 80%, 75%, 70%, 60% 50%, 40%, 30%, 25%, 20%, 15%, 10%, 5%, or less. In still alternative configurations, the power supply may be configured to have an adjustable duty cycle at or between any of the listed cycle percentages, as well as ranges of any of the recited cycles. Pulsing of the RF power supply may allow further adjustment of the etching parameters by allowing reduced and more selective removals. For example, when a large amount of material is being removed, a continuous supply of RF power may be utilized. On the other hand, when small amounts of material, or more selective removals are required, RF pulsing may be employed. The RF pulsing may be capable of removing amounts of less than 100 nm of material, or alternatively less than or about 50 nm, 30 nm, 22 nm, 15 nm, or less including down to a monolayer of deposited film.

Figure 4:
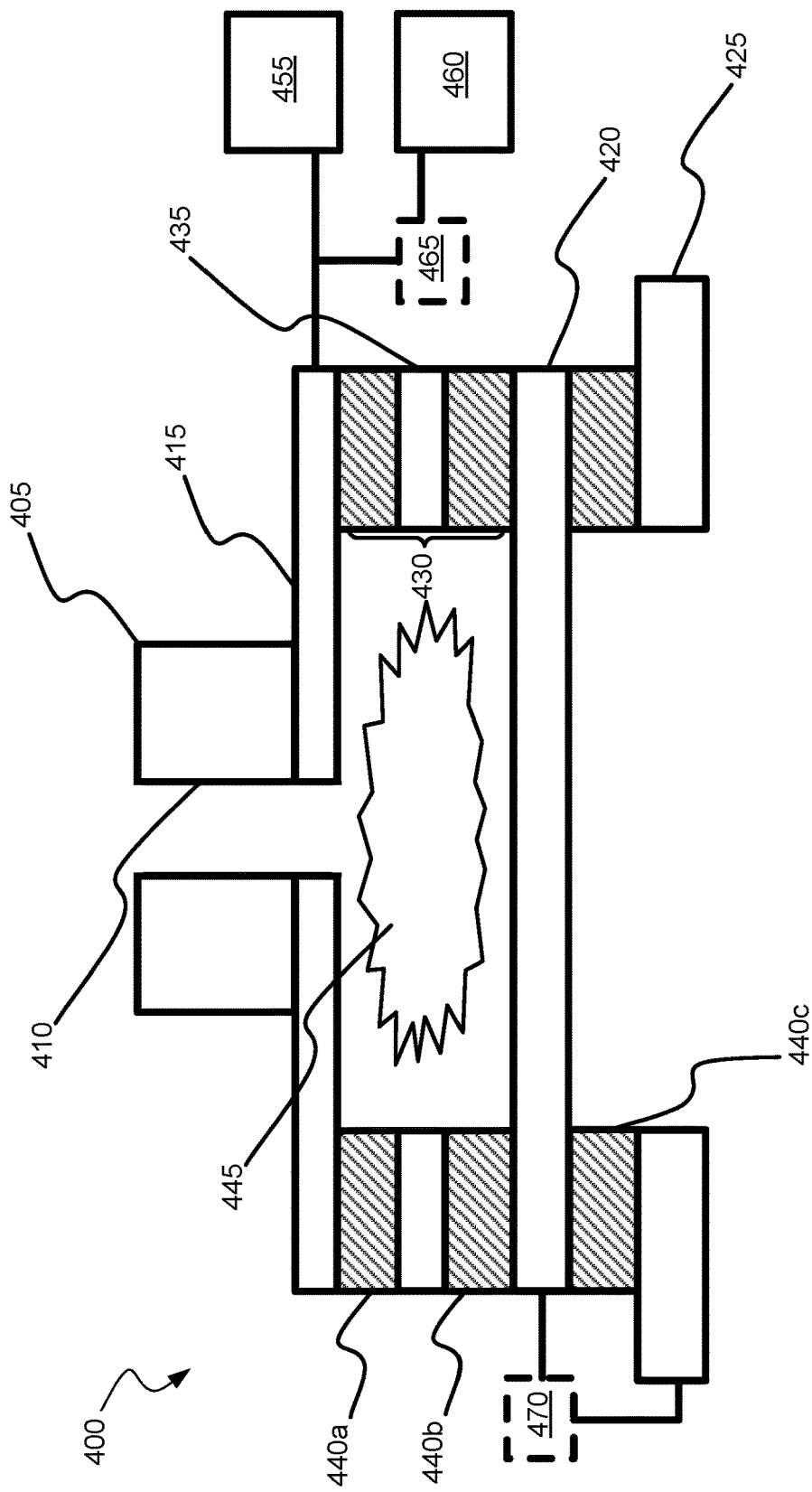
FIG. 4 shows a simplified cross-sectional view of another processing system having plasma generation components according to embodiments of the present technology.

FIG. 4 shows a simplified cross-sectional schematic of another processing system 400 having plasma generation components according to embodiments of the present technology. Chamber 405 of processing system 400 may include similar components as previously described with respect to FIG. 2. Chamber 405 may define a gas inlet 410 through which reactive precursor species may be delivered from, for example, a remote plasma unit (not shown). Chamber 405 may include a lid assembly 415, conductive insert 435, grid electrode 420, and ground electrode 425 along with additional chamber components. One or more of the lid assembly 415, conductive insert 435, grid electrode 420, and ground electrode 425 may be electrically isolated from the other listed components by one or more of a plurality of insulation members 440a-c. System 400 may additionally include power supplies 455, 460 as well as optional switches 465, 470 for electrically coupling the power supplies to the chamber, or components in the chamber to one another.

As illustrated in FIG. 4, power supply 455 is electrically coupled with lid assembly 415. In some embodiments, power supply 455 is an RF power supply. When in operation, the power supply 455 provides an electrical charge to lid assembly 415 which may act as a hot electrode for plasma generation. Grid electrode 420 may be coupled with ground electrode 425 thereby defining a plasma region 445 in which plasma may be generated, or plasma conditions may be modulated. The grid electrode 420 may be directly coupled with ground electrode 425, or alternatively may be electrically isolated with insulation member 440c. The insulation may be overcome by electrically coupling the grid electrode 420 and the ground electrode 425. A conductive means may be used to electrically couple the electrodes, and an exemplary system may utilize optional switch 470 for electrically coupling the components. RF power supply 455 may be configured to be adjustable with any of the parameters as previously discussed.

Power supply 460 may also be utilized during the operation of power supply 455, and may be a DC power supply in some embodiments. Exemplary DC power supplies may be configured for adjustable control with any of the parameters as previously described. DC power supply 460 may be operated in continuous or pulsing fashion as previously described. As illustrated in FIG. 4, DC power supply 460 is electrically coupled to lid assembly 415 along with RF power supply 455. Power supply 460 may be directly coupled with the lid assembly 415 or the electrical coupling of RF power supply 455, or electrically coupled to the lid assembly 415 or electrical coupling of RF power supply 455 with switch 465 that may be switchable to electrically couple DC power supply 460 to the components of the chamber 405.

In operation, RF power supply 455 and DC power supply 460 may be operated as illustrated in FIG. 4 to provide additional chemistry modulation of precursor species via an additional form of plasma modulation. Radical precursor species may be delivered to processing chamber 405 from a remote plasma system (not shown) fluidly coupled to gas inlet 410. RF power supply 455 may be operated as a continuous wave or pulsed to deliver modulated power to lid assembly 415. When engaged in the illustrated configuration, power supply 455 may generate a plasma in plasma region 445. Lid assembly 415, as the hot electrode, may be a major plasma generation area. As previously discussed, conventional operation in this way may have limited the duty cycle modulation of the RF power supply 455 due to the plasma characteristics in the plasma region 445. However, in the described exemplary configuration, DC power supply 460 may be operated to assist RF power supply 455 in maintaining plasma function in the plasma region 445. When RF power supply 455 is cycled off, DC power supply 460 may hold some plasma.

In one example, DC power supply 460 may be operated in continuous fashion while RF power supply 455 is pulsed. DC power supply 460, when electrically coupled with lid assembly 415 and operated continuously, may maintain a plasma in plasma region 445 generated by RF power supply 455. Accordingly, RF power supply may be modulated on and off, and continuously operated power supply 460 may maintain the plasma during the off cycle. As such, RF power supply 455 may be modulated with reduced duty cycles. For example, the duty cycle of the RF power may be operated from about 100% to about 0% during operation, less than or about 75%, less than or about 50%, or less than or about 25%. Alternatively, the duty cycle may be operated at about 90%, 80%, 75%, 70%, 60%, 50%, 40%, 30%, 25%, 20%, 15%, 10%, 5%, or less. In still alternative configurations, the power supply may be configured to have an adjustable duty cycle at or between any of the listed cycle percentages, as well as ranges of any of the recited cycles.

The pulsing capability of RF power supply 455 may be modulated continuously as previously discussed from continuous wave to about 1000 kHz or more. Alternatively, the RF may be adjusted in discrete increments from continuous wave to about 0.01 kHz, or alternatively about 0.1 kHz, 1 kHz, 10 kHz, 100 kHz, 1000 kHz, etc., or more. In still other embodiments, the RF power supply 455 may be pulsed in any variety or range of values between the listed values. When pulsed, the ion current may be reduced as compared to continuous wave operation. Because the DC power supply may assist in holding a plasma during the 'off' cycle of RF power supply 455, further pulsing modulation may be effected. Consequently, reduced etching may be performed to the level of less than 100 nm during an etching process. As the ion current is reduced during an etching process, the same time period for etching may result in a reduced etching amount. Accordingly, further reduction of the ion current via power supply modulation as discussed may allow etching amounts of less than or about 50 nm, 40 nm, 30 nm, 20 nm, 10 nm, 5 nm, etc., or less. Additionally, reducing the duty cycle may further modify the etching amounts by additionally reducing the ion current as the duty cycle is reduced. In combination, pulsing and reduced duty cycle may be combined to provide further chemistry modulation and ion current to allow improved flexibility of operation.

In comparison to the modulation discussed with respect to FIG. 3, the DC power supply may be utilized in several ways. When directed towards the conductive insert 435, the DC power supply may have a greater impact on ion and electron flux, and a positive and negative bias may be applied over a range of power levels to affect the chemistry of the precursors directed to the substrate. Alternatively, when the DC power supply 460 is coupled with the lid assembly in conjunction with the RF power supply 455, the DC power supply 460 may be used for plasma holding, and as such ion current may be further modulated via the RF power supply 455. Further, by utilizing switch 465 that may be electrically coupled with power supply 460, DC power supply 465 may be electrically coupled with different components of processing chamber 405 during different operations. As such, based on the type of etching being performed, types of precursors being used, etc., DC power supply 460 may be appropriately coupled with the chamber 405 to produce the plasma assistance most beneficial for the particular operation. Additionally, these parameters may be adjusted during operation such as if multiple deposited films are being removed, the coupling of power supply 460, and the modulation of both power supplies 455, 460 may be adjusted during processing when operational parameters may benefit from a change in etch performance.

Figure 5:
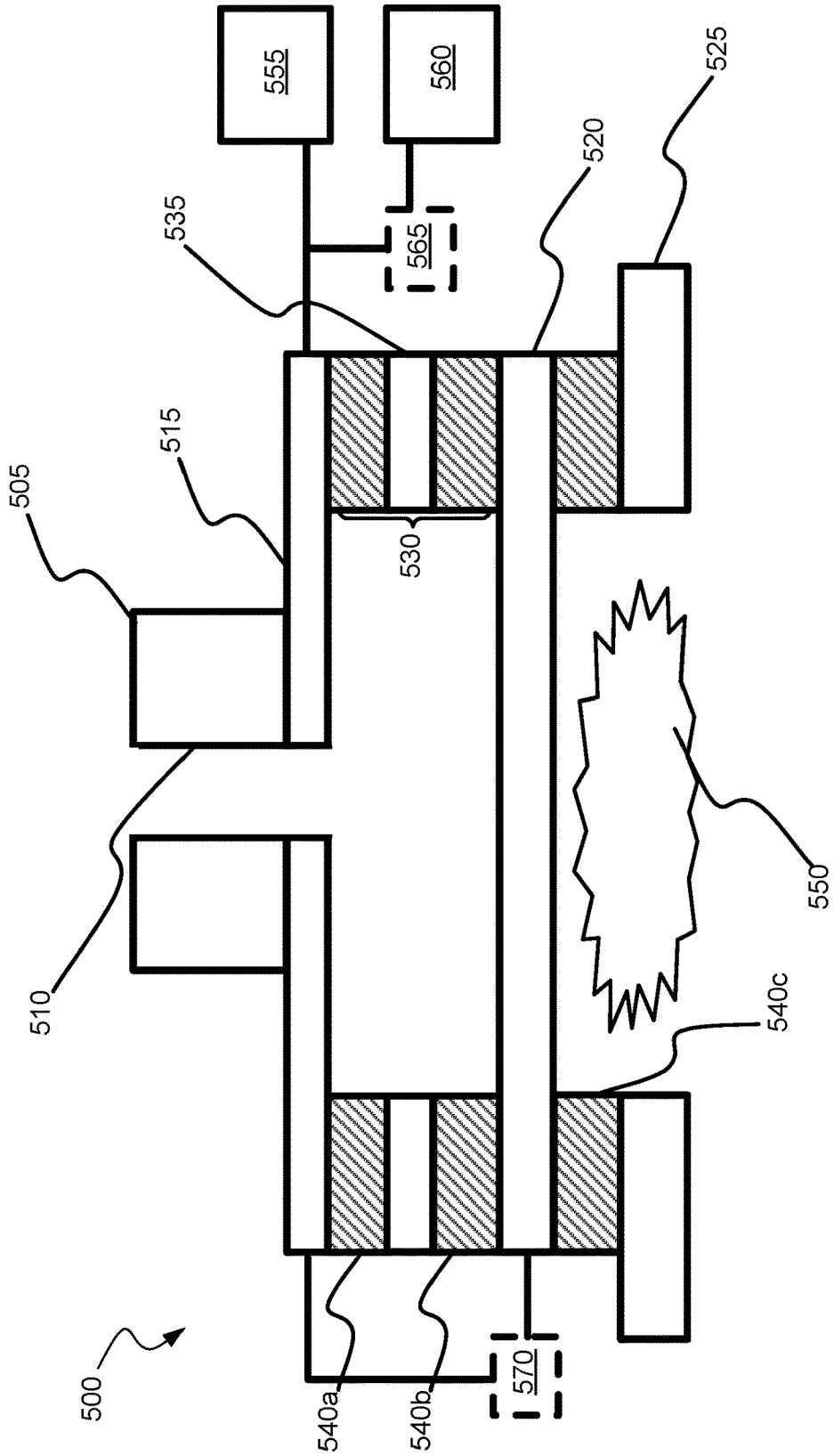
FIG. 5 shows a simplified cross-sectional view of another processing system having plasma generation components according to embodiments of the present technology.

FIG. 5 shows a simplified cross-sectional schematic of another processing system 500 having plasma generation components according to embodiments of the present technology. Chamber 505 of processing system 500 may include similar components as previously described with respect to FIG. 2. Chamber 505 may define a gas inlet 510 through which reactive precursor species may be delivered from, for example, a remote plasma unit (not shown). Chamber 505 may include a lid assembly 515, conductive insert 535, grid electrode 520, and ground electrode 525 along with additional chamber components. One or more of the lid assembly 515, conductive insert 535, grid electrode 520, and ground electrode 525 may be electrically isolated from the other listed components by one or more of a plurality of insulation members 540a-c. System 500 may additionally include power supplies 555, 560 as well as optional switches 565, 570 for electrically coupling the power supplies to the chamber, or components in the chamber to one another.

As illustrated in FIG. 5, power supply 555 is electrically coupled with lid assembly 515. In some embodiments, power supply 555 is an RF power supply. When in operation, the power supply 555 provides an electrical charge to lid assembly 515 which may act as a hot electrode for plasma generation. Grid electrode 520 may be coupled with lid assembly 515 which allows the hot electrode function to move to the grid electrode 520 level. As such, plasma generation may be shifted below the grid electrode 520 to the wafer level in plasma region 550. The grid electrode 520 may be electrically coupled with lid assembly, and an exemplary system may utilize optional switch 570 for electrically coupling the components. RF power supply 555 may be configured to be adjustable with any of the parameters as previously discussed.

Power supply 560 may also be utilized during the operation of power supply 555, and may be a DC power supply in some embodiments. Exemplary DC power supplies may be configured for adjustable control with any of the parameters as previously described. DC power supply 560 may be operated in continuous or pulsing fashion as previously described. As illustrated in FIG. 5, DC power supply 560 may be electrically coupled with lid assembly 515 along with RF power supply 555. Power supply 560 may be directly coupled with the lid assembly 515 or the electrical coupling of RF power supply 555, or electrically coupled to the lid assembly 515 or electrical coupling of RF power supply 555 with switch 565 that may be switchable to electrically couple DC power supply 560 to the components of the chamber 505.

The exemplary system configuration illustrated in FIG. 5 may be utilized for treatment operations. For example, after an etch process has been performed, such as with one of the prior etch configurations, byproducts may be formed or remain on the substrate surface. Remote plasma systems may be less effective in some circumstances than plasma generated at the wafer level. Accordingly, by utilizing the system configuration illustrated in FIG. 5, a more effective plasma treatment may be formed at the substrate level. However, depending on the type of byproduct and the amount remaining on the surface, plasma modulation may still be utilized with any of the operational manipulations previously discussed. Accordingly, by utilizing one or more of the power supply configurations as previously discussed, modulation of the treatment chemistry may be modulated as previously described. By utilizing switch 570 that may be switchable to couple multiple components of the processing chamber 505, multiple steps of semiconductor processing may be performed in the same chamber 505. For example, after the etching operation as described with regard to the embodiment shown in FIG. 4 is performed, switch 570 may be operated to switch the electrical coupling of the grid electrode 520 from the ground electrode 525 to the lid assembly 515. A subsequent treatment process may be performed with wafer level plasma as illustrated in FIG. 5. Alternatively, an etching operation may be performed as described with regard to the embodiment shown in FIG. 3. After the etching has been completed, switch 565 may be operated to switch the coupling of DC power supply 560 from the conductive insert 535 to the lid assembly 515 or RF power supply 555 electrical coupling, and switch 570 may be operated to switch the electrical coupling of the grid electrode 520 from the ground electrode 525 to the lid assembly 515. Many such options are available with the configurations and switching capabilities as described herein.

Figure 6:
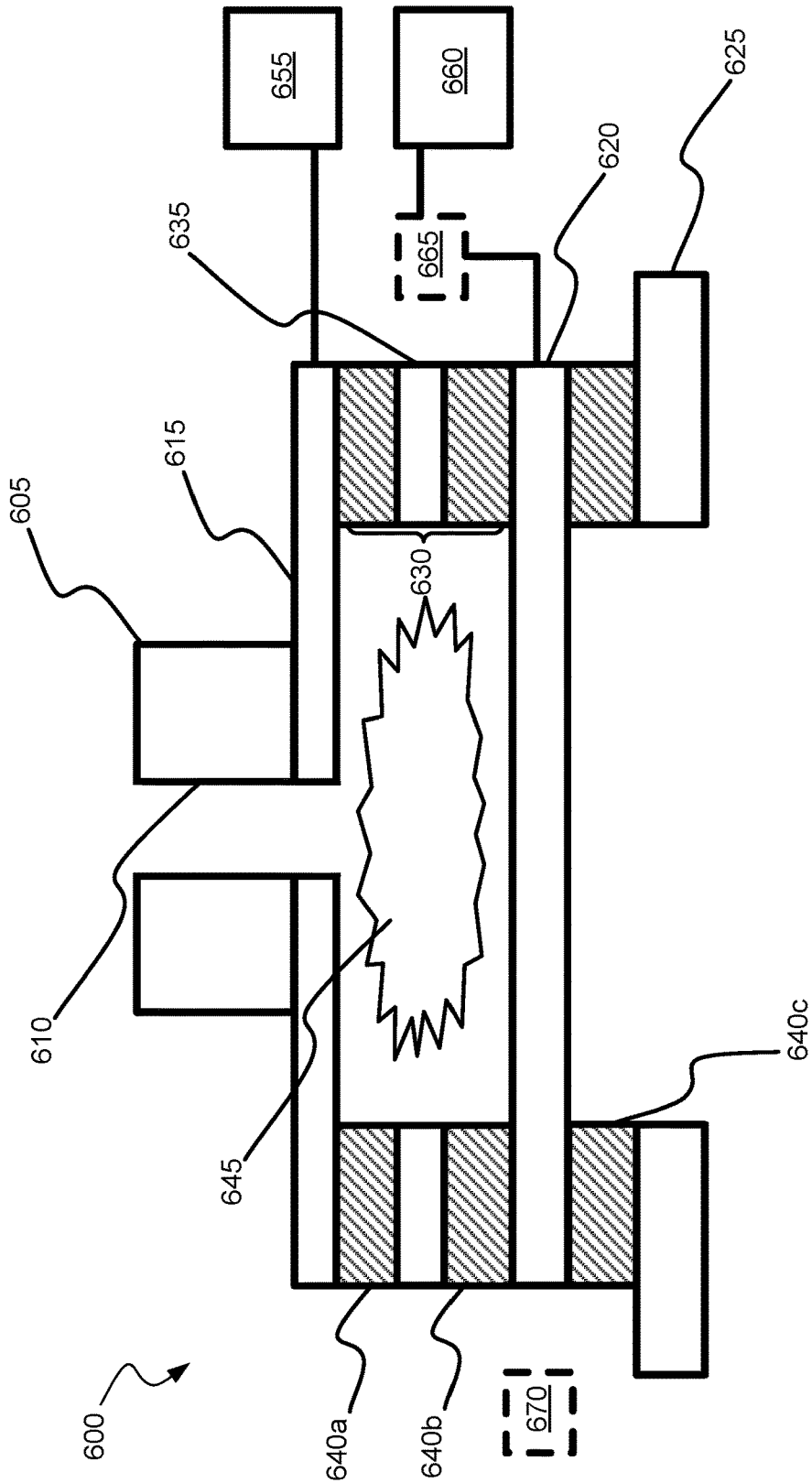
FIG. 6 shows a simplified cross-sectional view of another processing system having plasma generation components according to embodiments of the present technology.

FIG. 6 shows a simplified cross-sectional schematic of another processing system 600 having plasma generation components according to embodiments of the present technology. Chamber 605 of processing system 600 may include similar components as previously described with respect to FIG. 2. Chamber 605 may define a gas inlet 610 through which reactive precursor species may be delivered from, for example, a remote plasma unit (not shown). Chamber 605 may include a lid assembly 615, conductive insert 635, grid electrode 620, and ground electrode 625 along with additional chamber components. One or more of the lid assembly 615, conductive insert 635, grid electrode 620, and ground electrode 625 may be electrically isolated from the other listed components by one or more of a plurality of insulation members 640a-c. System 600 may additionally include power supplies 655, 660 as well as optional switches 665, 670 for electrically coupling the power supplies to the chamber, or components in the chamber to one another.

As illustrated in FIG. 6, power supply 655 is electrically coupled with lid assembly 615. In some embodiments, power supply 655 is an RF power supply. When in operation, the power supply 655 provides an electrical charge to lid assembly 615 which may act as a hot electrode for plasma generation. As compared to the embodiment discussed in FIG. 3, grid electrode 620 may not be electrically coupled with ground electrode 625. Accordingly, the ground electrode of the power system may be shifted from the grid electrode 620 to the ground electrode 625. In so doing, the plasma may develop over a slightly larger region of processing chamber 605 including into and through the grid electrode 620. RF power supply 455 may be configured to be adjustable with any of the parameters as previously discussed.

Power supply 660 may also be utilized during the operation of power supply 655, and may be a DC power supply in some embodiments. Exemplary DC power supplies may be configured for adjustable control with any of the parameters as previously described. DC power supply 660 may be operated in continuous or pulsing fashion as previously described, and also may be electrically coupled with any of the components of processing chamber 605 as previously described. In the exemplary system illustrated in FIG. 6, DC power supply 660 is electrically coupled with grid electrode 620. Power supply 660 may be directly coupled with grid electrode 620, or alternatively with switch 665 that may be switchable to electrically couple DC power supply 660 to the components of the chamber 605.

In operation, RF power supply 655 and DC power supply 660 may be operated as illustrated in FIG. 6 to provide additional chemistry modulation of precursor species via an additional form of plasma modulation. Radical precursor species may be delivered to processing chamber 605 from a remote plasma system (not shown) fluidly coupled with gas inlet 610. RF power supply 655 may be operated as a continuous wave or pulsed to deliver modulated power to lid assembly 615. When engaged in the illustrated configuration, power supply 655 may generate a plasma in plasma region 645. During certain etching or treatment operations, byproducts may remain in trench features previously etched. By allowing the plasma region 645 to expand to the level of the grid electrode 620 or below, additional removal of byproducts within etched features may be accomplished. The expanded plasma region may allow certain plasma species to interact at the substrate level and may provide directionality to species that may be utilized in byproduct removal. RF power supply 655 may be modulated via pulsing, or duty cycle modulation may be performed as previously described.

DC power supply 660 may be operated to assist RF power supply 655 in any of the ways previously described. When DC power supply 660 is electrically coupled with grid electrode 620, the DC power supply 660 may be used to provide additional ion and electron flux control with the plasma generated. When electrically coupled with the grid electrode, ion and electron flux can be adjusted through the grid electrode 620 components depending on the bias and power level of the DC power supply as explained above. Alternative embodiments may also electrically couple the DC power supply 660 with the conductive insert 635 or the lid assembly 615 as previously described.

Figure 7:
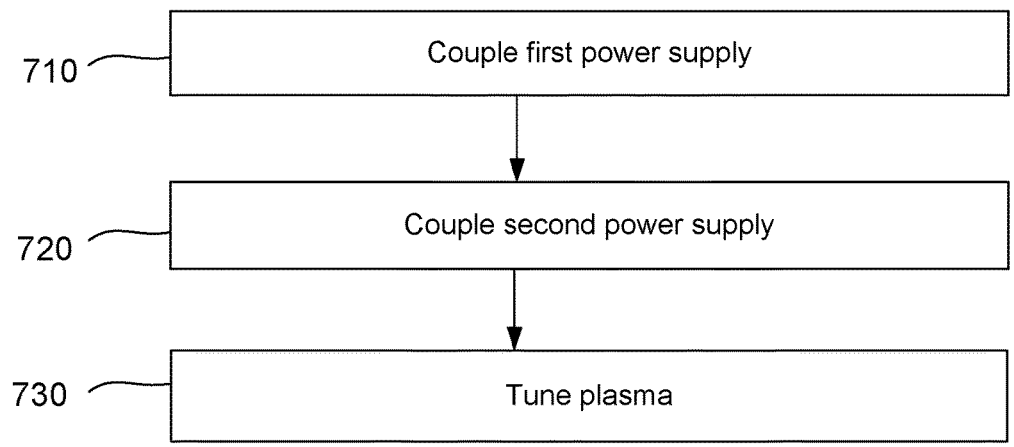
FIG. 7 illustrates operations of an exemplary method of tuning a plasma according to embodiments of the present technology.

Turning to FIG. 7 is shown a method of producing a plasma in a processing chamber according to the present technology. The chamber may be similar to chamber 100 as previously described. The chamber may include one or more power supplies such as supply 155. In operation 710, a first power supply may be coupled with the processing chamber lid assembly. The power supply may also be coupled electrically with additional or alternative structures of the processing chamber. In operation 720 a second power supply may be coupled with the processing chamber, and may be coupled with a similar or different portion of the processing chamber as the first power supply. For example, the second and/or first power supply may be coupled with a switch that may be switchably coupled with one or more conductive sections of the processing chamber. For example, the second power supply may be switchably coupled with the lid assembly or an additional conductive portion of the chamber as previously described.

A plasma may be ignited or otherwise formed in the processing chamber by engaging the first power supply. The action of coupling the power supply if engaged may ignite the plasma between the structure to which the first power supply is electrically coupled and a ground source located within the chamber. In operation 730, the second power supply may be used to tune the plasma profile in one or more ways. For example, a negative voltage may be applied with the second power supply, which may cause a greater electron flux to flow through the chamber such as towards a grid electrode or processing region. Also, a positive voltage may be applied with the second power supply to increase the ion flux through the chamber towards an electrode structure or the processing region. The first power supply may also be operated in a variety of modes, and for example, the first power supply may provide pulsing power to the lid assembly. In disclosed embodiments, the first power supply may include an RF power supply, and the second power supply may include a DC power supply.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present technology. Accordingly, the above description should not be taken as limiting the scope of the technology.

It is noted that individual embodiments may be described as a process which is depicted as a flowchart, a flow diagram, or a block diagram. Although a flowchart may describe the method as a sequential process, many of the operations may be performed in parallel or concurrently. In addition, the order of the operations may be rearranged. A process may be terminated when its operations are completed, but could have additional steps not discussed or included in a figure. Furthermore, not all operations in any particularly described process may occur in all embodiments. A process may correspond to a method, a function, a procedure, a subroutine, a subprogram, etc.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A semiconductor processing system comprising:
   a processing chamber that includes:
      a lid assembly defining a precursor inlet through which precursor species may be delivered;
      a ground electrode;
      a grid electrode disposed between the lid assembly and the ground electrode, and defining a first plasma region within the chamber between the grid electrode and the lid assembly and a second plasma region within the chamber between the grid electrode and the ground electrode;
      a conductive insert disposed between the lid assembly and the grid electrode at a periphery of the first plasma region and at least partially defining a section of a sidewall of the processing chamber;
      an insulation member positioned to electrically isolate the grid electrode from the conductive insert;
   a first power supply electrically coupled with the lid assembly; and
   a second power supply electrically coupled with at least one of the lid assembly, the grid electrode, or the conductive insert.

2. The semiconductor processing system of claim 1, further comprising a first switch that is electrically coupled with the second power supply, and that is switchable to electrically couple the second power supply to one of the lid assembly, the grid electrode, or the conductive insert.

3. The semiconductor processing system of claim 1, further comprising a second switch that is switchable to electrically couple at least two of the lid assembly, the ground electrode, or the grid electrode.

4. The semiconductor processing system of claim 3, wherein the first switch is switched to electrically couple the second power supply with the conductive insert, and wherein the second switch is switched to electrically couple the grid electrode and the ground electrode.

5. The semiconductor processing system of claim 4, wherein the second power supply is configured to deliver a negative voltage to the conductive insert, and wherein the first power supply is configured to ignite a plasma in the first plasma region where electron flux is directed to the grid electrode.

6. The semiconductor processing system of claim 4, wherein the second power supply is configured to deliver a positive voltage to the conductive insert, and wherein the first power supply is configured to ignite a plasma in the first plasma region where ion flux is directed to the grid electrode.

7. The semiconductor processing system of claim 3, wherein the first switch is switched to electrically couple the second power supply with the lid assembly such that both the first and second power supplies are electrically coupled with the lid assembly, and wherein the second switch is switched to electrically couple the grid electrode and the ground electrode.

8. The semiconductor processing system of claim 7, wherein the second power supply is configured to provide constant voltage to the lid assembly, and the first power supply is configured to provide pulsed frequency power to the lid assembly.

9. The semiconductor processing system of claim 3, wherein the first switch is switched to electrically couple the second power supply with the lid assembly such that both the first and second power supplies are electrically coupled with the lid assembly, and wherein the second switch is switched to electrically couple the grid electrode and the lid assembly.

10. The semiconductor processing system of claim 9, wherein the second power supply is configured to provide constant voltage to the lid assembly, and the first power supply is configured to provide pulsed frequency power to the lid assembly.

11. The semiconductor processing system of claim 3, wherein the first switch is switched to electrically couple the second power supply with the grid electrode.

12. The semiconductor processing system of claim 11, wherein the second power supply is configured to provide constant voltage to the grid electrode, and the first power supply is configured to provide pulsed frequency power to the lid assembly.

13. The semiconductor processing system of claim 1, wherein the first power supply is an RF power supply, and the second power supply is a DC power supply.

* * * * *